US012593537B2

(12) United States Patent
Ali et al.

(10) Patent No.: US 12,593,537 B2
(45) Date of Patent: Mar. 31, 2026

(54) SEMICONDUCTOR STRUCTURE AND METHOD OF MANUFACTURE

(71) Applicant: PORO TECHNOLOGIES LTD, Cambridge (GB)

(72) Inventors: Muhammad Ali, Cambridge (GB); Rachel Oliver, Cambridge (GB); Tongtong Zhu, Cambridge (GB)

(73) Assignee: PORO TECHNOLOGIES LTD, Cambridge (GB)

( * ) Notice: Subject to any disclaimer, the term of this patent is extended or adjusted under 35 U.S.C. 154(b) by 775 days.

(21) Appl. No.: 17/759,256

(22) PCT Filed: Jan. 22, 2021

(86) PCT No.: PCT/GB2021/050158
§ 371 (c)(1),
(2) Date: Jul. 21, 2022

(87) PCT Pub. No.: WO2021/148813
PCT Pub. Date: Jul. 29, 2021

(65) Prior Publication Data
US 2023/0053213 A1 Feb. 16, 2023

(30) Foreign Application Priority Data

Jan. 22, 2020 (GB) ..................................... 2000951
Apr. 20, 2020 (GB) ..................................... 2005730
(Continued)

(51) Int. Cl.
*H10H 20/817* (2025.01)
*H10H 20/01* (2025.01)
(Continued)

(52) U.S. Cl.
CPC .... *H10H 20/817* (2025.01); *H10H 20/01335* (2025.01); *H10H 20/81* (2025.01);
(Continued)

(58) Field of Classification Search
CPC ............. H10H 20/817; H10H 20/8162; H10H 20/825; H10H 20/01335; H10H 20/81; H10H 20/812; H10H 20/814
See application file for complete search history.

(56) References Cited

U.S. PATENT DOCUMENTS 8,436,334 B2 5/2013 Soh et al.
9,484,492 B2 11/2016 Bout et al.
(Continued)

FOREIGN PATENT DOCUMENTS

CN 107946417 A 4/2018
JP 2007-027298 A 2/2007
(Continued)

OTHER PUBLICATIONS

Office Action for related Japanese Patent Application No. 2022-544132 (Aug. 13, 2024).
(Continued)

*Primary Examiner* — Mark W Tornow
(74) *Attorney, Agent, or Firm* — Merchant & Gould P.C.

(57) ABSTRACT

A semiconductor structure comprises a layer of a first III-nitride material having a first lattice dimension; a non-porous layer of a second III-nitride material having a second lattice dimension different from the first lattice dimension; and a porous region of III-nitride material disposed between the layer of first III-nitride material and the non-porous layer of the second III-nitride material. An optoelectronic semi-conductor device, an LED, and a method of manufacturing a semiconductor structure are also provided.

18 Claims, 19 Drawing Sheets

<div style="display: flex;">
<div>

(30) Foreign Application Priority Data

| | | | |
|---|---|---|---|
| Aug. 4, 2020 | (GB) | ..................................... | 2012098 |
| Aug. 4, 2020 | (GB) | ..................................... | 2012103 |
| Aug. 4, 2020 | (GB) | ..................................... | 2012108 |
| Aug. 4, 2020 | (GB) | ..................................... | 2012110 |
| Nov. 16, 2020 | (GB) | ..................................... | 2018016 |

(51) Int. Cl.

| | |
|---|---|
| *H10H 20/81* | (2025.01) |
| *H10H 20/812* | (2025.01) |
| *H10H 20/814* | (2025.01) |
| *H10H 20/816* | (2025.01) |
| *H10H 20/825* | (2025.01) |

(52) U.S. Cl.
CPC ........ *H10H 20/812* (2025.01); *H10H 20/814* (2025.01); *H10H 20/8162* (2025.01); *H10H 20/825* (2025.01)

(56) References Cited

U.S. PATENT DOCUMENTS

| | | | |
|---|---|---|---|
| 10,361,341 | B2 | 7/2019 | Danesh et al. |
| 2009/0001416 | A1 | 1/2009 | Chua et al. |
| 2009/0140274 | A1 | 6/2009 | Wierer, Jr. et al. |
| 2010/0140629 | A1 | 6/2010 | Lee et al. |
| 2016/0197151 | A1* | 7/2016 | Han ...................... H10F 77/146 |
| | | | 438/468 |
| 2017/0237234 | A1* | 8/2017 | Han ...................... H01S 5/1042 |
| | | | 372/45.012 |
| 2019/0123235 | A1 | 4/2019 | Cho et al. |
| 2020/0227255 | A1 | 7/2020 | Zhu et al. |

</div>
<div>

FOREIGN PATENT DOCUMENTS

| | | | |
|---|---|---|---|
| JP | 2007-173316 | A | 7/2007 |
| JP | 2007-537600 | A | 12/2007 |
| JP | 2009-021361 | A | 1/2009 |
| JP | 2011-501408 | A | 1/2011 |
| JP | 2012-038824 | A | 2/2012 |
| JP | 2014-090169 | A | 5/2014 |
| JP | 2014127708 | A | 7/2014 |
| JP | 2018-505567 | A | 2/2018 |
| JP | 2018-533847 | A | 11/2018 |
| JP | 2019-036719 | A | 3/2019 |
| KR | 20140010587 | A | 1/2014 |
| WO | 2005/112123 | A2 | 11/2005 |
| WO | 2009/038324 | | 3/2009 |
| WO | 2013/140320 | | 9/2013 |
| WO | 2018/080860 | A1 | 5/2018 |
| WO | 2019/027820 | A1 | 2/2019 |
| WO | 2019/063957 | | 4/2019 |
| WO | 2019/145728 | | 8/2019 |

OTHER PUBLICATIONS

International Search Report and Written Opinion of PCT/GB2021/050158, Apr. 15, 2021, 15 pages.

Pasayat, Shubhra S. et al., "Compliant Micron-Sized Patterned InGaN Pseudo-Substrates Utilizing Porous GaN"; Materials 13. 213; (2020) doi:10.3390, 10 pages.

Pasayat, Shubhra S. et al., "Growth of strain-GaN on micrometer-sized patterned compliant relaxedInGaN", Applied Physics Letters, Jan. 16, 2020, vol. 116, No. 11, 6 pages.

* cited by examiner

</div>
</div>

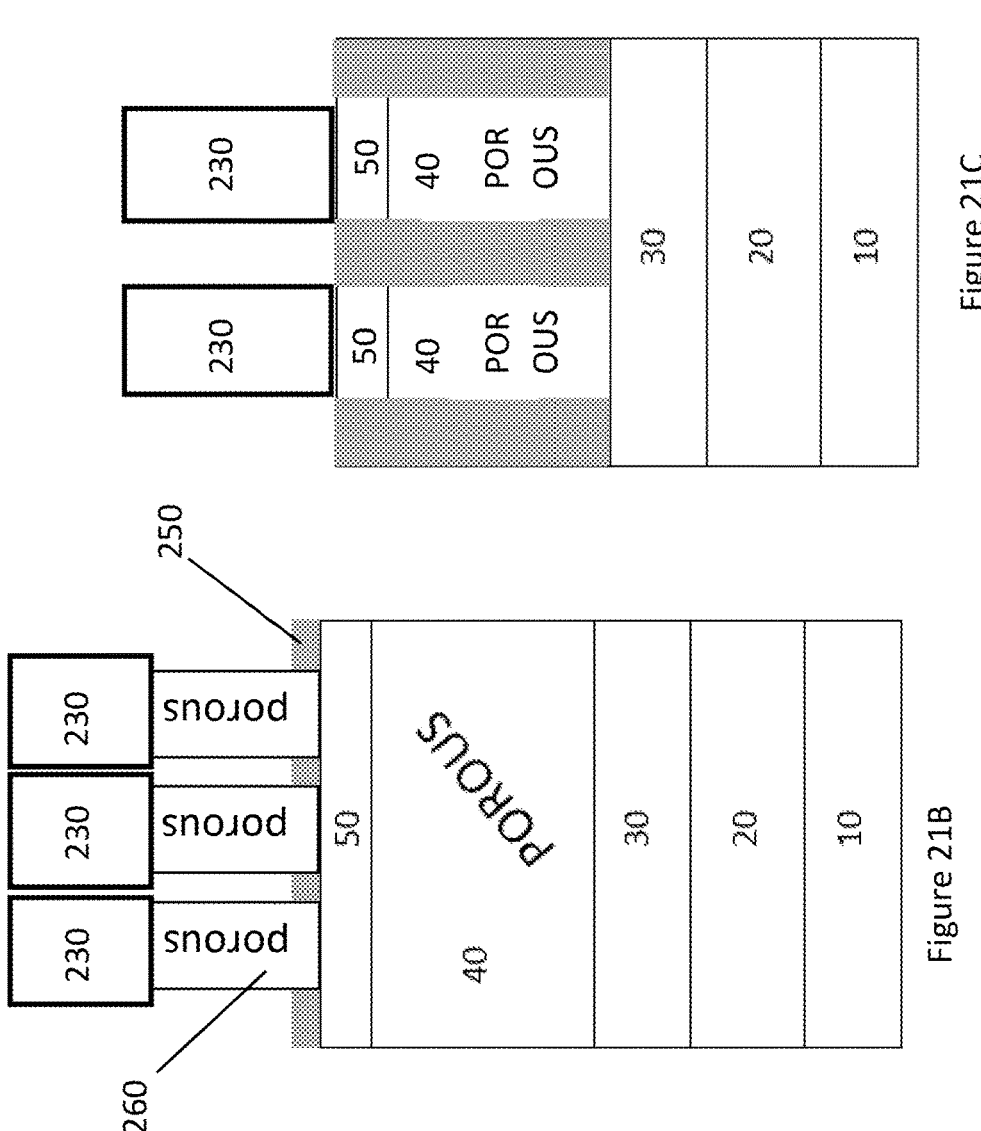
Figure 21C
Figure 21B
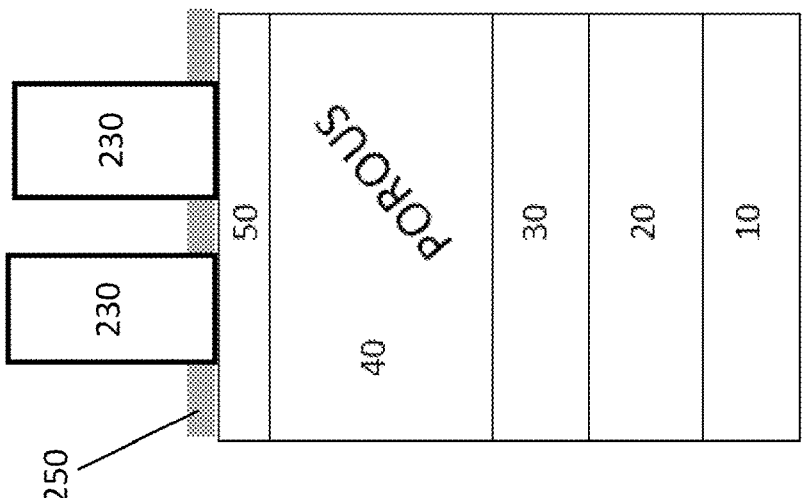
Figure 21A

SEMICONDUCTOR STRUCTURE AND METHOD OF MANUFACTURE

The present invention relates to a semiconductor structure and a method of manufacture for semiconductor structures, in particular to optoelectronic devices including LEDs lasing devices, and an improved method of manufacturing opto-electronic devices.

BACKGROUND

A particular problem in semiconductor device manufacture arises from the different crystal lattice dimensions of different semiconductor materials. It is desirable to create multilayer structures in which layers of different semiconductors are grown on top of one another, with high quality boundaries between layers. However, problems occur at boundaries between layers of different semiconductor compositions which have different crystal lattice dimensions.

III-V semiconductor materials are of particular interest for semiconductor device design, in particular the family of III-nitride semiconductor materials.

"III-V" semiconductors include binary, ternary and quaternary alloys of Group III elements, such as Ga, Al and In, with Group V elements, such as N, P, As and Sb), and are of great interest for a number of applications, including opto-electronics.

Of particular interest is the class of semiconductor materials known as "III-nitride" materials, which includes gallium nitride (GaN), indium nitride (InN) and aluminium nitride (AlN), along with their ternary and quaternary alloys. (Al,In)GaN is a term encompassing AlGaN, InGaN and GaN, and intermediate compositions. III-nitride materials have not only achieved commercial success in solid-state lighting and power electronics, but also exhibit particular advantages for quantum light sources and light-matter interaction.

Alloying of InN and AlN into GaN semiconductor material is of interest for optoelectronic semiconductor devices, as varying the Al and/or In content of the semiconductor alters the electronic bandgap of the material, and therefore the wavelength at which the semiconductor emits light. However, varying the Al and/or In content of the material also affects the in-plane lattice constant of the semiconductor, as illustrated in FIG. 1. For example, the in-plane lattice constant of InN is roughly 11% larger than that of GaN, with the lattice dimensions of intermediate compositions varying depending on the indium content.

This creates a problem in device design where it is desirable to deposit an active semiconductor layer on top of a substrate layer that has different lattice dimensions. The reason for this is that the lattice mismatch at the layer boundary introduces strain into the lattice which leads to the formation of defects in the material which act as non-radiative recombination centres. This significantly harms device performance.

One of the big challenges facing the growth of long wavelength LEDs on GaN-based platforms, for example, is the requirement to use high indium (In) contents to reduce the bandgap in the active region to an appropriate level for long-wavelength emission. The required InGaN active regions have a larger lattice dimension than the underlying GaN and the resulting strain leads to the formation of defects in the material which act as non-radiative recombination centres deteriorating device performance.

High quality InGaN (with high Indium content>20 at. %) is therefore difficult to achieve, due to the large lattice mismatch between InN and GaN. The misfit strain also results in a reduced indium composition through the composition pulling effect.

Due to these problems, prior attempts to produce semiconductor devices containing lattice mismatches have not met expectations. In particular, prior attempts to produce long-wavelength LEDs and short-wavelength UV LEDs on GaN platforms have not been successful.

SUMMARY OF INVENTION

The present application relates to an improved method of manufacturing semiconductor devices, in particular opto-electronic devices, and to semiconductor devices made using that method.

The invention is defined in the independent claims, to which reference should now be made. Preferred or advantageous features of the invention are defined in the appended sub-claims.

The semiconductor devices, or LEDs, described in the present application are preferably formed from III-V semiconductor material, particularly preferably from III-nitride semiconductor material.

"III-V" semiconductors include binary, ternary and quaternary alloys of Group III elements, such as Ga, Al and In, with Group V elements, such as N, P, As and Sb), and are of great interest for a number of applications, including opto-electronics, power electronics and RF electronics.

Of particular interest is the class of semiconductor materials known as "III-nitride" materials, which includes gallium nitride (GaN), indium nitride (InN) and aluminium nitride (AlN), along with their ternary and quaternary alloys (Al,In)GaN. Different crystal orientations may be used in the present invention, such as polar c-plane, non-polar and semi-polar orientations. There are two primary non-polar orientations, a-plane (11-20) and m-plane (1-100). For semi-polar, there are (11-22), {2021} which is a family of crystal planes. III-nitride materials have not only achieved commercial success in solid-state lighting and power electronics, but also exhibit particular advantages for quantum light sources and light-matter interaction.

While a variety of III-nitride materials are commercially interesting, Gallium nitride (GaN) is widely regarded as one of the most important new semiconductor materials, and is of particular interest for a number of applications.

It is known that the introduction of pores into bulk GaN can profoundly affect its material properties (optical, mechanical, electrical, and thermal, etc.). The possibility of tuning the optical properties of GaN by altering its porosity therefore makes porous GaN of great interest for optoelectronic applications.

The present invention will be described by reference to GaN and InGaN, AlGaN, AlN and AlInGaN, but may advantageously be applicable to alternative III-nitride material combinations with lattice mismatches.

In the following description, a substrate or "template" for overgrowth is a semiconductor structure, on which a further semiconductor layer is to be grown in order to result in a semiconductor device. An exemplary template for overgrowth in the present invention may be a GaN semiconductor structure, comprising multiple layers of doped and undoped GaN.

Layers of the semiconductor structure may be porosified by electrochemical etching as set out in international patent applications PCT/GB2017/052895 (published as WO2019/063957) and PCT/GB2019/050213 (published as WO2019/145728).

The inventors have found that semiconductor structures and devices which usually contain problematic lattice mismatches can be provided using the present invention.

Semiconductor Structure

According to a first aspect of the invention there is provided a semiconductor structure comprising:

a layer of a first III-nitride material having a first lattice dimension;

a non-porous layer of a second III-nitride material having a second lattice dimension different from the first lattice dimension; and a porous region of III-nitride material disposed between the layer of first III-nitride material and the non-porous layer of the second III-nitride material. The present inventors have realised that electrochemical porosification of III-nitride materials advantageously leads to a reduction in the strain in the III-nitride lattice. This means that the process of porosifying the porous region of III-nitride material etches away structural defects, such as threading dislocations which were formed during growth of that layer on top of the layer of first III-nitride material.

Preferably the porous region has a lattice dimension between the first and the second lattice dimensions.

The first and second lattice dimension may be termed first and second lattice parameters, or first and second lattice constants. Preferably the lattice dimension is a physical dimension of one side of a unit cell in a crystal lattice. Preferably the first and second lattice dimensions (or lattice parameters or lattice constants) refer to the a-lattice parameter for each respective material lattice, or alternatively to the b-lattice parameter for each respective material lattice.

The removal of dislocations from the semiconductor material of the porous region during porosification greatly reduces the strain in the porous region, which occurs particularly if the lattice dimension of the porous region does not match the first lattice dimension of the underlying layer of first III-nitride material. Thus, during epitaxial growth of the semiconductor structure when the non-porous layer of the second III-nitride material is deposited onto the porous region, the porous material is more compliant to matching the lattice of the overlying non-porous layer. This results in the non-porous layer of second III-nitride material experiencing significantly lower strain than would be the case had the second III-nitride material been deposited directly onto the layer of first III-nitride material.

As the second III-nitride material experiences lower strain, there are also fewer structural defects in the non-porous layer to act as non-radiative recombination centres to harm device performance.

Composition pulling effect: Kawaguchi et al. reported a so-called InGaN composition pulling effect in which the indium fraction is smaller during the initial stages of growth but increases with increasing growth thickness. This observation was to a first extent independent of the underlying layer, GaN or AlGaN. The authors suggested that this effect is caused by strain caused by the lattice mismatch at the interface. They found that a larger lattice mismatch between InGaN and the bottom epitaxial layers was accompanied by a larger change in the In content.

The inventors have found that the use of a porous region in the semiconductor structure leads to "strain relaxation" which reduces strain in the layers of a semiconductor structure, and that this can lead to an improvement with respect to the composition pulling effect. The present invention can therefore aid in higher Indium incorporation into the non-porous layer of the second III-nitride material, which is highly desirable for semiconductor devices, in particular in optoelectronic applications, RF and power electronics, for example in passive (resonator, filter) or active (amplifier, transistor) components.

The first and second III-nitride materials may be any III-nitride material, and are preferably selected from the list of: GaN, AlN, InN, InGaN, AlGaN, InAlN, InAlGaN.

The first and second III-nitride materials may be doped or undoped.

The doping, or charge carrier concentration, may vary from layer to layer. For example, two separate layers of the semiconductor structure may both be formed from InGaN, but one layer may be n-doped while the other layer is undoped.

The semiconductor may comprise an inert substrate underlying the layer of first III-nitride material. The substrate may be formed, for example, of Si, SiC, $Al_2O_3$, GaN, AlN, or sapphire. This inert substrate may be a base substrate on which the layers of III-nitride material are deposited during manufacturing. However, the substrate may be removed from the semiconductor structure during processing, for example by laser lift-off, etching or polishing.

The layer of first III-nitride material may be termed a buffer layer, a template, or a pseudo-substrate, or a base layer, or a platform. During manufacture, the layer of III-nitride material is preferably positioned in the semiconductor structure between the inert substrate used for epitaxial growth, and the porous region of III-nitride material.

The semiconductor structure may advantageously comprise further layers of III-nitride material overlying the non-porous layer of second III-nitride material.

The semiconductor structure may advantageously be used as a substrate for further overgrowth.

The porous region may be a porous layer, such that the semiconductor structure comprises a porous layer of III-nitride material disposed between the layer of first III-nitride material and the non-porous layer of the second III-nitride material. Preferably the porous region may be a porous layer that is continuously porous, for example formed from a continuous layer of porous III-nitride material.

The porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. The non-porous layer of second III-nitride material may be formed over a porous region comprising a stack of porous layers of III-nitride material.

Alternatively the porous region may be a layer of III-nitride material that contains one or more porous regions, for example one or more porous regions in an otherwise non-porous layer of III-nitride material.

In preferred embodiments, the porous region, or porous layer, may have a lateral dimension (width or length) equivalent to that of the substrate on which the porous layer or region is grown. For example, conventional substrate wafer sizes may have a variety of sizes, such as 1 $cm^2$, or 2 inch, 4 inch, 6 inch, 8 inch, 12 inch, or 16 inch diameter. By patterning one or more layers and/or depositing regions of different charge carrier concentrations in the same layer, however, smaller porous regions can be formed that do not span the entire substrate. The lateral dimensions of the porous layer or region may therefore vary from around 1/10 of a micro-pixel (for example 0.1 μm), up to the lateral dimensions of the substrate itself.

Preferably the first III-nitride material from which the layer of first III-nitride material is formed is GaN, preferably undoped GaN. In this embodiment the first lattice dimension is therefore the lattice dimension or lattice parameter of GaN. For GaN, the a-lattice parameter (a) from literature is 3.18940 Angstroms.

While the layer of first III-nitride material may be formed from III-nitride materials other than GaN, in the following description the layer of first III-nitride material will be described as GaN for the purpose of explanation.

In a preferred embodiment of the invention, the second III-nitride material is $In_xGa_{1-x}N$, preferably n-doped $In_xGa_{1-x}N$, in which x≥0, preferably in which x>0. As described above, InGaN has a crystal lattice with larger atomic spacing than that of a pure GaN lattice, with the lattice dimensions increasing with increasing In content. This means that epitaxial deposition of InGaN directly onto a GaN epilayer is typically not desirable, as the lattice mismatch creates significant strain at the boundary between the two materials. The same problem is experienced when depositing other III-nitride materials onto GaN, when the lattice dimension of the deposited material is different from that of GaN. For example, the same problem is experienced with GaN/AlGaN boundaries, as AlGaN has a smaller lattice dimension than GaN.

In the present invention, this problem of lattice mismatch is solved by providing the porous region of III-nitride material disposed between the layer of first III-nitride material and the non-porous layer of the second III-nitride material. The porous region may advantageously be formed from a third III-nitride material. The third III-nitride material may have a composition (for example an indium content and/or aluminium content) different from the first and second compositions of the first and second III-nitride materials, such that the third III-nitride material may have a third lattice dimension different from the first and second lattice dimensions.

In preferred embodiments of the invention, the second III-nitride material is $In_xGa_{1-x}N$. X>0, and preferably 0.1<x<0.8, or 0.1<x<0.6, particularly preferably 0.10<x<0.35. Particularly preferably x=0.25 or x=0.35.

In order to bridge the gap between the lattice dimensions of the GaN layer (the layer of first III-nitride material), and the larger lattice of the second III-nitride material, the porous region may advantageously be formed from the same material as the non-porous layer, or alternatively from the same type of material but with a different level of doping in the lattice. Preferably the porous region may be formed from (Al,In)GaN, that is, AlGaN, or InGaN, or GaN.

In order to bridge the gap between the lattice dimensions of the GaN layer, and the larger lattice of a non-porous layer of $In_xGa_{1-x}N$, for example, the porous region may advantageously formed from a third III-nitride material which is $In_yGa_{1-y}N$, in which 0<y≤x. Thus, the In content of the porous region may be 0, which may be suitable if x is very small, or y may be equal to x, in which case the composition of the porous region is the same as that of the non-porous layer of second III-nitride material. Alternatively, the In content of the porous region may be between 0 (GaN) and x (the same as the non-porous layer), so that the lattice dimension of the porous region is somewhere between the lattice dimensions of GaN and $In_xGa_{1-x}N$.

InGaN may be particularly advantageous for the creation of longer-wavelength LEDs, for example green and red LEDs (size>200 μm) and mini-LEDs (<200 μm) and micro- LEDs (size <100 μm or <50 μm), and other optoelectronic devices such as lasers and solar cells.

In one preferred exemplary embodiment, the first III-nitride material is GaN, which has an a-lattice parameter from literature of 3.18940 Angstroms. The second III-nitride material is $In_{0.09}GaN$ (9%-average atomic indium composition), which should have an a-lattice parameter of 3.22137 Angstroms. In this particular embodiment, the porous region is a porous layer of $In_{0.09}GaN$, which is a porous version of the 9 at. % indium InGaN used in the non-porous layer of second III-nitride material. The a-lattice parameter of the porous $In_{0.09}GaN$ was measured to be 3.19735 Angstroms. This demonstrates that even in the same material composition, the porosification of the porous layer led to a significant difference of 0.02402 Angstroms in the a-lattice parameter, due to the relaxation of strain when the pores are formed in the porous layer. This gives a degree of 25% strain relaxation.

In an alternative preferred embodiment, the second III-nitride material is $Al_zGa_{1-z}N$, preferably n-doped $Al_zGa_{1-z}N$, in which z>0. AlGaN may be particularly advantageous for the creation of shorter-wavelength LEDs, for example UV LEDs, and other optoelectronic devices such as UV lasers and UV photodetectors and sensors.

The second III-nitride material may be $Al_zGa_{1-z}N$ and 0.1<z<0.9. Preferably 0.6<z<0.8, which may be particularly suitable for a UVC 280 nm LED for example.

When AlGaN is used as the second III-nitride material, the porous structure may be formed from porous GaN, porous AlGaN of any Al content, or porous AlN.

When AlGaN is used as the second III-nitride material, the porous structure may preferably be formed from a third III-nitride material which is $Al_wGa_{1-w}N$, in which 0<w≤1, preferably in which 0<w≤z.

In order to minimise strain-creating lattice mismatch between the porous region and the non-porous layer, the porous region may be formed from the second III-nitride material.

The non-porous layer of the second III-nitride material may have an interface directly in contact with the porous region. That is, the non-porous layer of the second III-nitride material may be epitaxially grown directly onto the porous region, so that the two layers share an epitaxial boundary.

The semiconductor structure may comprise one or more intermediate layers of III-nitride material disposed between the porous region and the non-porous layer of the second III-nitride material, preferably in which the intermediate layer is (Al,In)GaN.

The semiconductor structure preferably comprises a non-porous intermediate layer of III-nitride material porous region between the porous region and the non-porous layer of the second III-nitride material. As the porous region is preferably formed by electrochemical porosification through a non-porous layer of III-nitride material, using the method of PCT/GB2017/052895 (published as WO2019/063957) and PCT/GB2019/050213 (published as WO2019/145728), the non-porous layer of III-nitride material typically forms a non-porous intermediate layer which remains on top of the porous region. The non-porous intermediate layer may advantageously provide a smooth surface for overgrowth of further layers.

The structure may comprise a further layer of a third III-nitride material having a third lattice dimension different from the first and second lattice dimensions, in which the non-porous layer of the second III-nitride material is disposed between the further layer and the porous region. For example, the further layer may be an overgrown layer deposited on top of the non-porous layer of second III-nitride material.

A surface of the non-porous layer of the second III-nitride material may be an outer surface of the structure, and the semiconductor structure may be suitable for overgrowth of further semiconductor material onto the surface of the non-porous layer. Alternatively, there may be additional layers or structures of semiconductor material arranged over the non-porous layer of the second III-nitride material.

As the structure of the present invention comprises strain-free "relaxed" non-porous layers of III-nitride material, for example strain relaxed InGaN and AlGaN, the structure of the present invention is particularly suitable for use as part of an optoelectronic device like an LED or a laser device. In order to form an LED, the semiconductor structure of the first aspect may be used as a substrate or template for overgrowth, and the active components of the LED may be overgrown onto the structure. The present invention may also be particularly suitable for use as part of power electronics devices, or RF electronics devices, for example in passive components such as resonators and filters, or in active components such as amplifiers and transistors.

The strain compliant semiconductor structure of the present invention may be advantageously suitable for use as part of a lasing device, for example edge emitting lasers or vertical cavity surface emitting lasers (VCSELs), or lasers in any other geometry that requires long wavelength emission.

A structure with a strain relaxed GaN and/or InGaN non-porous layer may advantageously be particularly suitable for use in light emitting devices, such as LEDs with InGaN active light emitting regions for example, while a strain relaxed GaN and/or AlGaN non-porous layer may advantageously be particularly suitable for use in light emitting devices, such as LEDs with AlGaN active light emitting regions.

A variety of structures may be formed using the structure of the first aspect. For example, the structure may comprise a plurality of porous regions. Alternatively the structure may comprise a distributed Bragg reflector (DBR) structure comprising a plurality of porous regions of III-nitride material.

A variety of structures and geometries may also be formed in the semiconductor structure by etching portions of the structure using a mask.

As lattice dimensions are intrinsically linked to the atomic composition of the semiconductor lattice, the first aspect of the invention may alternatively provide a semiconductor structure comprising:

a layer of a first III-nitride material having a first composition;

a non-porous layer of a second III-nitride material having a second composition different from the first composition; and a porous region of III-nitride material disposed between the layer of first III-nitride material and the non-porous layer of the second III-nitride material.

In a first preferred embodiment the first and second compositions may be first and second atomic indium contents. In a second preferred embodiment the first and second compositions may be first and second atomic aluminium contents.

In certain embodiments, the porous region may have a composition between the first and second compositions, for example an atomic indium content equal to or greater than the atomic indium content of the first III-nitride material, and less than or equal to the atomic indium content of the second III-nitride material. In some alternative embodiments, the porous region may have an atomic aluminium content equal to or greater than the atomic aluminium content of the first III-nitride material, and less than or equal to the atomic aluminium content of the second III-nitride material.

In a preferred aspect, the invention may provide a semiconductor structure comprising:

a layer of a first III-nitride material having a first atomic indium content;

a non-porous layer of a second III-nitride material having a second atomic indium content different from the first atomic indium content; and a porous region of III-nitride material disposed between the layer of first III-nitride material and the non-porous layer of the second III-nitride material.

In preferred embodiments, the second III-nitride material has a higher indium content than the first III-nitride material. In some preferred embodiments, the indium content of the first III-nitride material may be 0, while the second III-nitride material has an indium content of greater than 0.

All of the features described above in relation to the first aspect of the invention apply equally to these further aspects, as the lattice dimensions are influenced by the atomic compositions of the layers in the semiconductor structure.

In a further aspect of the invention there may be provided a semiconductor structure comprising:

a layer of a first III-nitride material having a first lattice dimension;

a non-porous layer of $In_xGa_{1-x}N$ having a second lattice dimension different from the first lattice dimension; and a porous region of $In_yGa_{1-y}N$ disposed between the layer of first III-nitride material and the non-porous layer of the second III-nitride material.

In this aspect $x>0$, preferably $0.1<x<0.8$, or $0.1<x<0.6$, particularly preferably $0.10<x<0.35$.

In this aspect preferably $0<y\leq x$. This may advantageously allow the porous region to bridge the lattice mismatch between the layer of first III-nitride material and the non-porous layer of $In_xGa_{1-x}N$. In particularly preferred embodiments, $0.03<y<0.11$ or $0.07<y<0.11$, or in other words, the porous region of $In_yGa_{1-y}N$ contains between 3 at. % and 11 at. % indium, or between 7 at. % and 11 at. % indium.

Advantages of this structure are set forth in relation to the other aspects in the present disclosure.

In a further preferred aspect, the invention may provide a semiconductor structure comprising:

a layer of a first III-nitride material having a first atomic aluminium content;

a non-porous layer of a second III-nitride material having a second atomic aluminium content different from the first atomic aluminium content; and a porous region of III-nitride material disposed between the layer of first III-nitride material and the non-porous layer of the second III-nitride material.

In preferred embodiments, the second III-nitride material has a higher aluminium content than the first III-nitride material. In preferred embodiments, the aluminium content of the first III-nitride material may be 0, while the second III-nitride material has an aluminium content of greater than 0.

In a further aspect of the invention there may be provided a semiconductor structure comprising:

a layer of a first III-nitride material having a first lattice dimension;

a non-porous layer of $Al_zGa_{1-z}N$ having a second lattice dimension different from the first lattice dimension; and a porous region of $Al_wGa_{1-w}N$ disposed between the layer of first III-nitride material and the non-porous layer of the second III-nitride material.

In this aspect $z>0$, preferably $0.1<z<0.9$, preferably $0.6\leq z\leq 0.8$.

In this aspect preferably $0<w\leq z$. This may advantageously allow the porous region to bridge the lattice mismatch between the layer of first III-nitride material and the non-porous layer of $Al_zGa_{1-z}N$.

Advantages of these structures are set forth in relation to the other aspects in the present disclosure.

Optoelectronic Devices

According to a second aspect of the present invention there is provided an optoelectronic semiconductor device, comprising:

a semiconductor structure according to the first aspect, or any of the aspects of the invention described above; and an active light emitting region.

The active light emitting region preferably overlies the semiconductor structure.

In a preferred embodiment, the non-porous layer of the second III-nitride material may be doped, and may form a portion of the active light emitting region of the optoelectronic device.

Alternatively, the active light emitting region may be formed as further layers overgrown on top of the semiconductor structure of the first aspect. The optoelectronic device may comprise one or more intermediate layers of III-nitride material disposed between the non-porous layer of the second III-nitride material and the active light emitting region. For example, the entire light emitting region may be overgrown on top of the semiconductor structure, with the semiconductor structure of the first aspect acting only as a strain-relaxed base, or platform, for the device.

The optoelectronic device may be, for example, an LED or a lasing device such as an edge emitting laser or vertical cavity surface emitting laser (VCSEL).

Preferably the active light emitting region of the device may comprise the same III-nitride material as the non-porous layer of the second III-nitride material. This may advantageously maximise the strain relaxation benefit of the present invention so that the light emitting region is strain relaxed, thanks to being overgrown on the strain-relaxed non-porous layer of the second III-nitride material.

LEDs

According to a third aspect of the present invention there is provided a light-emitting diode (LED), comprising:

a semiconductor structure according to the first aspect, or any of the aspects of the invention described above; and an LED active region overlying the non-porous layer of the second III-nitride material.

The non-porous layer of the second III-nitride material may be a doped layer which forms one side of a p-i-n junction.

The non-porous layer of the second III-nitride material may be a doped layer which forms one side of a tunnel junction.

Alternatively, the LED may comprise one or more intermediate layers of III-nitride material disposed between the non-porous layer of the second III-nitride material and the LED active region. For example, the entire p-i-n junction may be overgrown on top of the semiconductor structure, with the semiconductor structure of the first aspect acting only as a strain-relaxed base for the LED.

The LED active region may be termed an LED light emitting region. Preferably, the LED active region comprises one or more quantum wells, particularly preferably InGaN quantum wells or AlGaN quantum wells.

In a preferred embodiment the second III-nitride material may be $In_xGa_{1-x}N$ with $x>0$, and the LED active region may comprise one or more InGaN quantum wells.

It is not required that the second III-nitride material is formed from the same III-nitride material as the active light-emitting region of the device. However, in order to maximise the benefit of the strain relaxation effect, it may be preferred that the composition (and therefore lattice dimensions) of the non-porous layer of second III-nitride material and the composition (and therefore lattice dimensions) of the light-emitting region are similar or identical.

In order to avoid lattice mismatch between the quantum wells and the underlying layers the InGaN quantum wells and the second III-nitride material may both have the composition $In_xGa_{1-x}N$, in which $0.22\leq x\leq 0.3$, preferably $x=0.25$. The InGaN quantum wells and the second III-nitride material may have different respective compositions within this range, though in a preferred embodiment both the InGaN quantum wells and the second III-nitride material may have the same composition. This LED may preferably be a green LED with an emission wavelength of around 500-565 nm, preferably 525 nm.

In an alternative embodiment, the InGaN quantum wells and the second III-nitride material both have the composition $In_xGa_{1-x}N$, in which $0.32\leq x\leq 0.40$, preferably $x=0.35$. The InGaN quantum wells and the second III-nitride material may have different respective compositions within this range, though in a preferred embodiment both the InGaN quantum wells and the second III-nitride material may have the same composition. This LED may preferably be a red LED with an emission wavelength of around 620-740 nm.

The second III-nitride material may be $Al_zGa_{1-z}N$ with $z>0$, and the LED active region may comprise one or more AlGaN quantum wells.

The AlGaN quantum wells and the second III-nitride material may both have the composition $Al_zGa_{1-z}N$, in which $0.1\leq z\leq 0.9$, preferably $0.6\leq z\leq 0.8$. The AlGaN quantum wells and the second III-nitride material may have different respective compositions within this range, though in a preferred embodiment both the AlGaN quantum wells and the second III-nitride material may have the same composition. This LED may preferably be a UV LED with an emission wavelength of around 260-380 nm, preferably 265 nm when $z=0.6-0.8$.

Semiconductor Device

According to a further aspect of the present invention there is provided a semiconductor device, comprising:

a semiconductor structure according to the first aspect, or any of the aspects of the invention described above; and a semiconductor device structure.

The semiconductor device structure preferably overlies the semiconductor structure.

The semiconductor device may be, for example, a power electronics component, or an RF electronics component. In particularly preferred examples, the semiconductor device may be a passive electronic component, such as a resonator or a filter, or an active component such as an amplifier or a transistor. Thus the semiconductor device structure may be a resonator structure, or a filter structure, or an amplifier structure, or a transistor structure.

The semiconductor device structure may be a known structure, for example a layered structure usable for a conventional power or RF electronics device, which is in this case overgrown on a semiconductor structure according to an aspect of the present invention. The strain relaxation benefit of the present invention may thus advantageously provide a strain relaxation benefit to the overgrown device structure.

Method of Manufacture

According to a fourth aspect of the present invention there is provided a method of manufacturing a semiconductor structure, comprising the steps of:

electrochemically porosifying a layer of III-nitride material formed on a layer of a first III-nitride material having a first lattice dimension, to form a porous region of III-nitride material; and depositing, above or over the porous region of III-nitride material, a non-porous layer of a second III-nitride material having a second lattice dimension different from the first lattice dimension, so that the porous region is disposed between the substrate and the non-porous layer of the second III-nitride material.

The porosification step may be carried out by electrochemical etching as set out in international patent applications PCT/GB2017/052895 (published as WO2019/063957) and PCT/GB2019/050213 (published as WO2019/145728).

The method may comprise the step of depositing one or more intermediate layers of III-nitride material on the surface of the porous region of III-nitride material, and then depositing the non-porous layer of a second III-nitride material on the one or more intermediate layers.

The method may comprise the step of depositing the non-porous layer of a second III-nitride material onto the surface of the porous region of III-nitride material.

As the electrochemical etching methods of PCT/GB2017/052895 (published as WO2019/063957) and PCT/GB2019/050213 (published as WO2019/145728) relate to etching sub-surface layers of semiconductor material through a non-porous surface layer, in preferred embodiments there is a non-porous intermediate layer of III-nitride material which remains over the porous region following porosification. The presence of this non-porous intermediate layer provides a smoother surface for subsequent overgrowth, which is advantageous for the quality of further layers. The method may thus comprise the step of depositing one or more intermediate, or connecting, layers of III-nitride material on the surface of the non-porous intermediate layer, or the step of depositing the non-porous layer of a second III-nitride material onto the surface of the non-porous intermediate layer of III-nitride material.

The method may comprise the step of overgrowing one or more layers of III-nitride material on the surface of the non-porous layer of the second III-nitride material.

The semiconductor structure is a semiconductor structure according to the first aspect, or any of the other preferred aspects defined above. Thus, the layers and compositions of the structure may be as described above.

Method of Forming an Optoelectronic Device

According to a fifth aspect of the present invention there is provided a method of forming an optoelectronic device, comprising the step of: forming an active light emitting region on the semiconductor structure of the first aspect, or any of the other aspects described above.

The active light emitting region may be formed on the semiconductor structure using any suitable semiconductor deposition technique known to the skilled person.

The description of each aspect of the invention set out above is applicable equally to the other aspects of the invention.

BRIEF DESCRIPTION OF THE DRAWINGS

Specific embodiments of the invention will now be described with reference to the figures, in which:

As illustrated in FIG. 2, a semiconductor structure according to the present invention includes a layer of a first III-nitride material having a first lattice dimension, which may be termed a "template", a "substrate" or a pseudo-substrate. This is shown at the bottom of the structure in FIG. 2, and is preferably formed from undoped GaN.

A porous region of III-nitride material, which is illustrated as porous layer of (Al, In)GaN (GaN which may be alloyed with AlN and/or InN) is provided above the substrate layer by epitaxial deposition. As shown in FIG. 1, the higher the Al or In content of the GaN, the greater the lattice mismatch between the GaN substrate and the (Al,In)GaN layer. This lattice mismatch creates strain in the (Al,In)GaN layer during its growth, and creates structural defects in the lattice such as threading dislocations which are formed during growth of that layer on top of the layer of first III-nitride material.

The present inventors have realised that, by porosifying the strained (Al,In)GaN layer, the strain in the (Al,In)GaN lattice can be engineered, e.g. reduced. This then creates a strain-compliant layer which can accommodate overgrowth of further layers of semiconductor material, so that the overgrown layers are "relaxed" and inherit less strain from the substrate lattice during growth.

Figure 1:
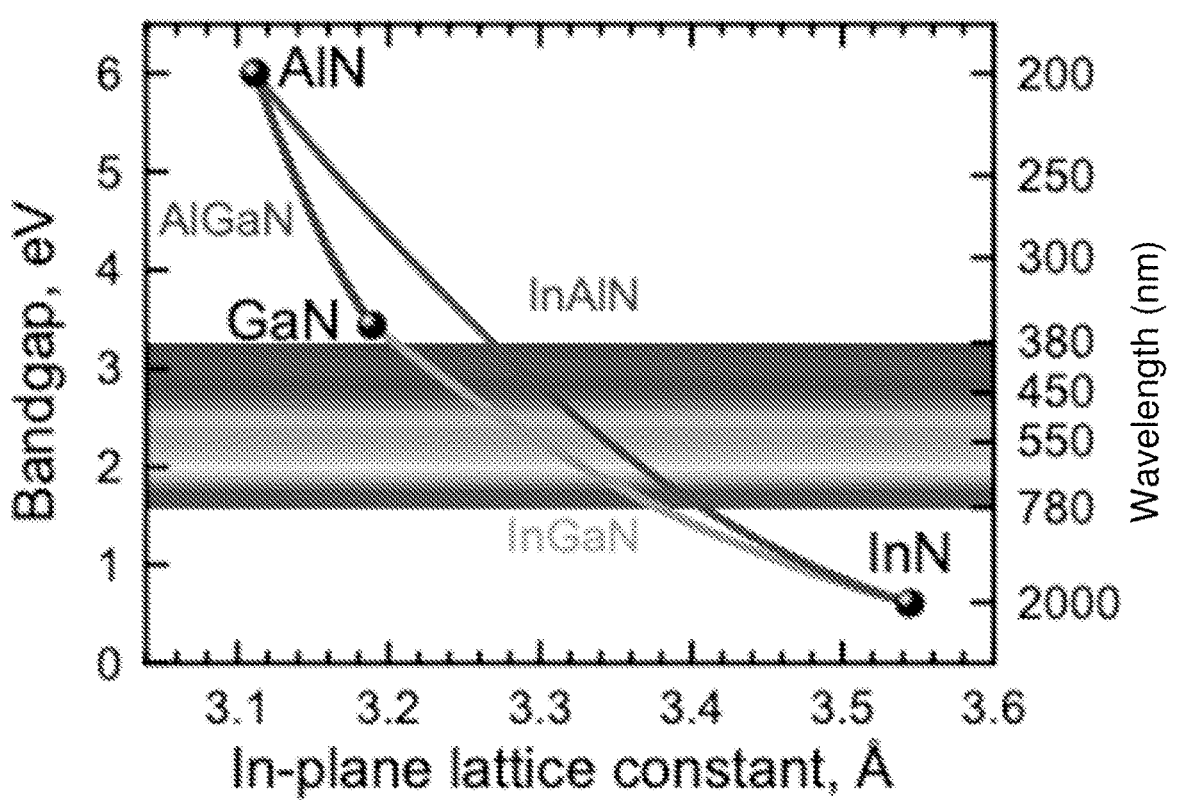
FIG. 1 shows a graph of electronic bandgap vs in-plane lattice constant for a range of III-nitride materials usable in the present invention.
Figure 2:
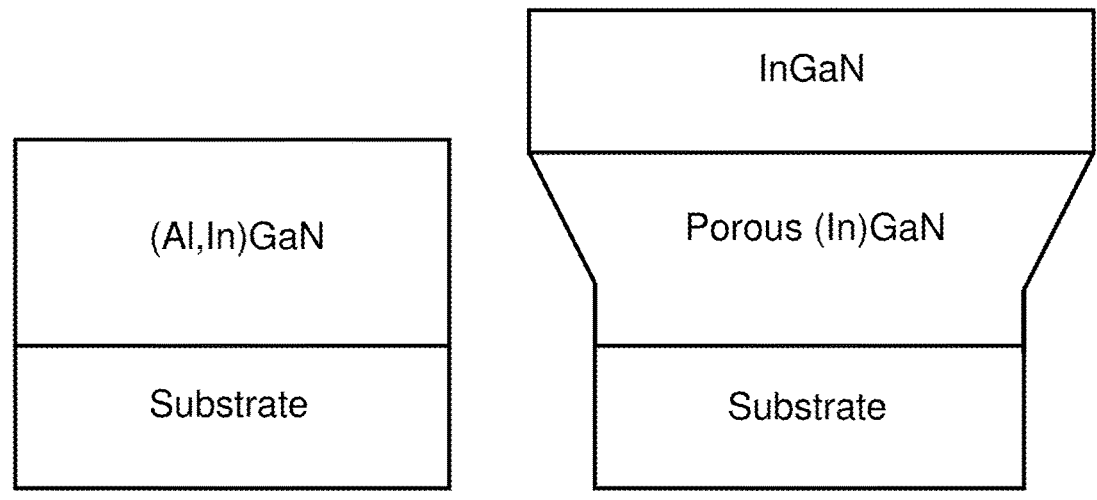
FIG. 2 is a schematic diagram showing how a semiconductor structure according to the present invention accommodates a lattice mismatch.

FIG. 2 shows a relaxed InGaN layer overgrown on top of a porous (In)GaN layer, for example, and illustrates how the porous region can act as a strain-compliant "bridge" to accommodate the lattice mismatch between the substrate material and the overgrown InGaN material with a larger lattice dimension.

Figure 3:
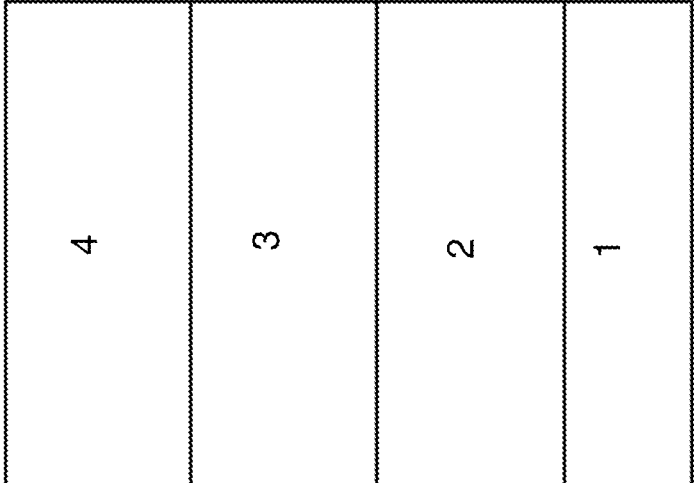
FIG. 3 is a schematic diagram illustrating the layers of a simple semiconductor structure according to the claims.

FIG. 3 schematically illustrates the layers of the semiconductor structure according to the claims. A substrate 1 forms the base of the semiconductor structure. The substrate may be any conventional semiconductor substrate, for example Si, SiC, Al2O3, GaN, or AlN. An (Al,In,Ga)N buffer layer 2 is epitaxially grown on the substrate. The (Al,In,Ga)N buffer layer 2 is the layer of the first III-nitride material, and has a first lattice constant. (Al,In,Ga)N means this layer could be AlN, AlaN, GaN, InGaN, or InN. A porous layer 3 of porous (Al,In,Ga)N is positioned on top of the buffer layer 2. The porous layer 3 could be a porous form of AlN, AlGaN, GaN, InGaN, or InN. A non-porous layer 4 of (Al,In)GaN is positioned on top of the porous layer 3. The non-porous layer 4 is the layer of the second III-nitride material, and has a second lattice constant that is different from the first lattice constant of the buffer layer 2. The non-porous layer 4 may be AlGaN, InGaN or GaN. The porous (Al,In,Ga)N layer 3 is disposed between the buffer layer 2 and the non-porous layer 4. As these layers have different lattice constants, the intervening porous layer 3 between them acts as a strain-compliant "bridge" to accommodate the lattice mismatch between the layers.

Figure 4:
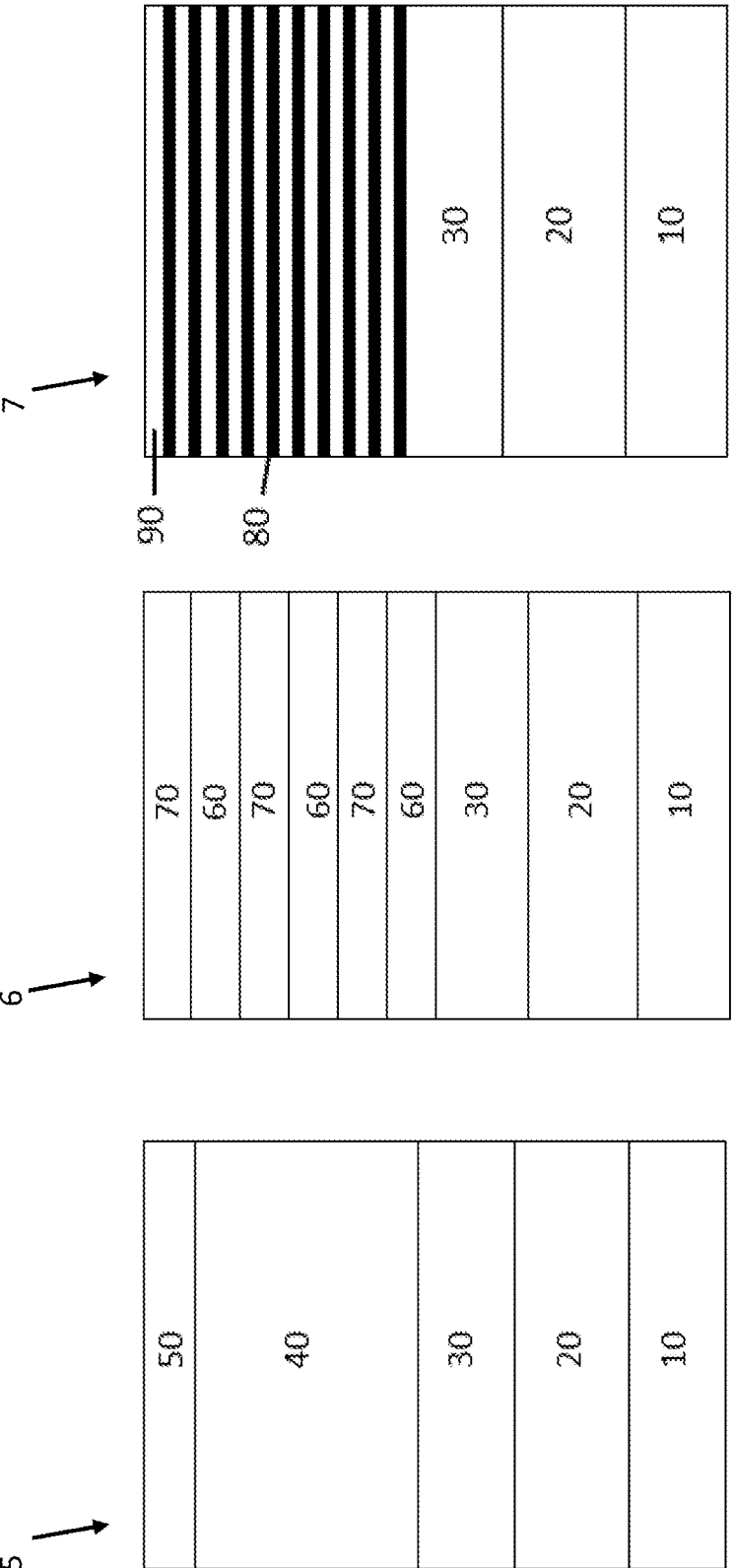
FIG. 4 is a schematic illustration of three exemplary semiconductor structures suitable for processing into the semiconductor structure according to the present invention.

FIG. 4 shows three exemplary layered semiconductor structures that are processable into the semiconductor structure of the present invention. Although layer thicknesses and compositions are indicated for illustration, these apply only to three exemplary embodiments, and semiconductor structures having alternative layer thicknesses and compositions are of course possible.

Each of the three illustrated structures are based on a substrate 10, which may for example be silicon or sapphire, and a GaN buffer layer 20, which in preferred embodiments has a thickness of 1-2 μm.

Each of the three structures contains an undoped GaN layer 30 acting as the layer of first III-material, having the lattice dimension of undoped GaN.

Above the undoped GaN layers 30, the three structures have differing layered structures all based on $In_{0.11}Ga_{0.89}N$. The level of doping in these layers differs from structure to structure, and but the important factor is that the n-doped $In_{0.11}Ga_{0.89}N$ layers are capable of being porosified by electrochemical porosification as set out in international patent applications PCT/GB2017/052895 (published as WO2019/063957) and PCT/GB2019/050213 (published as WO2019/145728). A variety of porous structures and layer designs may be provided, such as a DBR, depending on the application.

InGaN layers in the illustrated examples may preferably contain 3%-11% indium, but in these three particular embodiments (shown in FIG. 4 onward for the sake of example only) the InGaN layers 40, 50, 60, 70 contain 11% Indium, or are provided as alternating InGaN layers 90, 80 containing 7% and 11% indium respectively.

The left-hand structure 5 in FIG. 4 contains a 250 nm-thick layer 40 of n+ doped $In_{0.11}Ga_{0.89}N$, under a 50 nm-thick undoped layer 50 of $In_{0.11}Ga_{0.89}N$. During porosification, only the highly doped layer 40 is porosified, while the undoped layer 50 remains non-porous.

The middle structure 6 in FIG. 4 contains a 6-layer stack of alternating 50 nm-thick layers 60 of n+ doped $In_{0.11}Ga_{0.89}N$, and 50 nm-thick undoped layers 70 of $In_{0.11}Ga_{0.89}N$. During porosification, only the highly doped layers 60 are porosified, while the undoped layers 70 remain non-porous.

The right-hand structure 7 in FIG. 4 contains a 20-layer stack of alternating 20 nm-thick layers 80 of n+ doped $In_{0.07}Ga_{0.93}N$, and 20 nm-thick undoped layers 90 of $In_{0.11}Ga_{0.89}N$. During porosification, only the highly doped layers 80 are porosified, while the undoped layers 90 remain non-porous.

After porosification, the n+doped (heavily n-type doped) $In_{0.11}Ga_{0.89}N$ layers are porous. The removal of threading dislocations during porosification advantageously reduces the strain and increases the surface to volume ratio in these layers. This strain-relaxation effect is achieved even when the structure contains undoped layers that are not porosified during the porosification step.

Further non-porous layers of InGaN (the second III-nitride material) 100, for example $In_{0.11}Ga_{0.89}N$, may be overgrown directly onto the top surface of the $In_{0.11}Ga_{0.89}N$ layers. Thanks to the strain reduction in the porous layers, the overgrown non-porous material will then be "relaxed" as it is less strained than it would have been if it were grown directly onto GaN. In this way, a strain-relaxed layer of InGaN 100 may be formed on the relatively-thick GaN platform, despite the lattice mismatch between the GaN and InGaN lattices.

Figure 5:
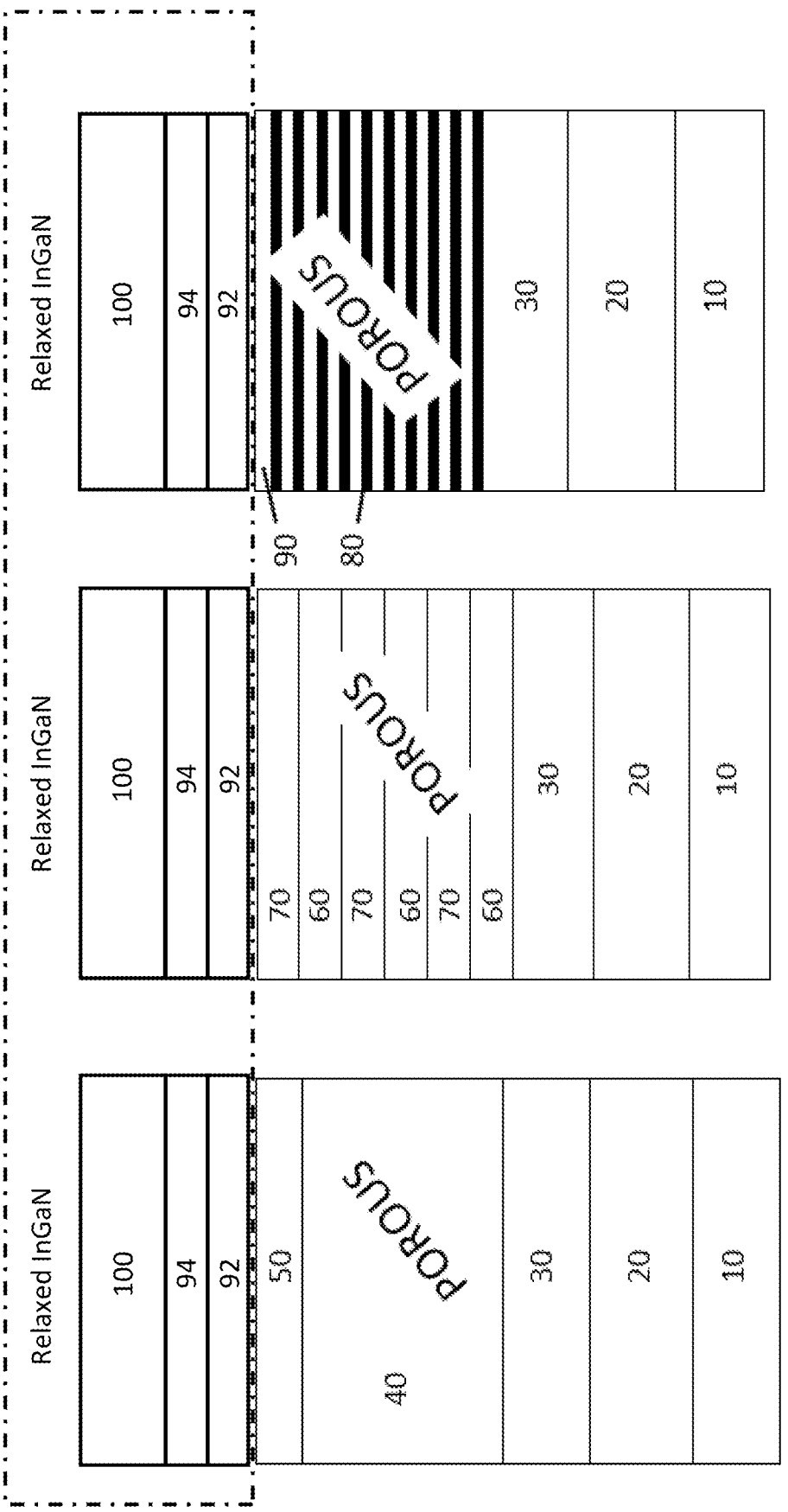
FIG. 5 is a schematic illustration of three semiconductor structures according to the present invention.

Alternatively to forming the non-porous layers of InGaN, for example $In_{0.11}Ga_{0.89}N$, by overgrowth directly onto the top surface of the porous semiconductor structures 5, 6, 7, intermediate III-nitride layers (preferably thin intermediate layers) may be disposed between the porous regions and the non-porous layer of InGaN. As shown in FIG. 5, for example, additional intermediate layers 92, 94 of GaN may be formed between the templates 5, 6, 7 and the non-porous layer of InGaN 100. These intermediate layers may be preferable in some applications.

In one preferred example, a 10 nm thick layer of NID (non-intentionally-doped) GaN 92 and 20 nm thick layer of n-GaN 94 are overgrown on the templates, prior to the growth of a 200 nm thick layer of n-$In_{0.11}Ga_{0.89}N$ 100.

As these layers 92, 94, 100 are overgrown on top of a porous template with relaxed strain, these layers also benefit from the relaxed lattice strain, and form a relaxed InGaN structure on top of the templates.

Semiconductor devices, in particular optoelectronic devices, may advantageously be formed by overgrowing further layers of III-nitride material over the semiconductor structures of FIG. 5.

Figure 6:
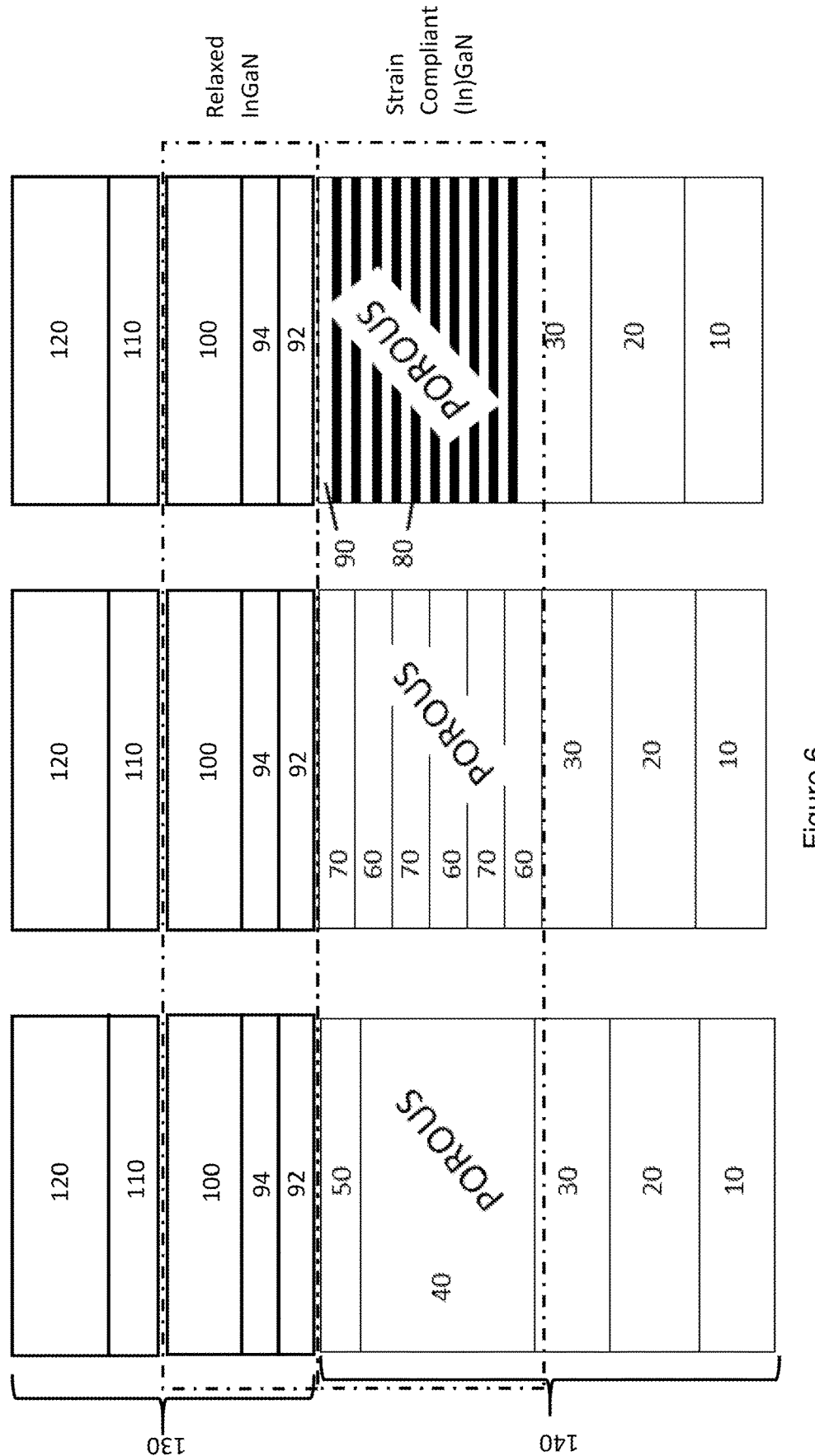
FIG. 6 is a schematic illustration of three LEDs according to the present invention, formed based on the three semiconductor structures of FIG. 5.

A particularly preferred application of the semiconductor structure is in an LED. As shown in FIG. 6, the active light emitting region 130 of an LED may be formed on the semiconductor structure 140 (formed by porosifying templates 5, 6, 7 respectively), which acts as a strain compliant porous template.

In the exemplary structures of the Figures, the non-porous layer 100 of $In_{0.11}Ga_{0.89}N$ is n-doped. Thus, this strain-relaxed InGaN layer 100 may be used as the n-doped side of an LED active light-emitting region 130. Over this layer, a layer of InGaN quantum wells (QWs) 110 and a further p-doped layer 120 of (In)GaN are grown to form the light-emitting region of the LED.

The indium content of the quantum wells 110 may be tuned to determine the emission wavelength of the LED as desired.

While not essential, the composition of the quantum wells may match, or be similar to the composition of the underlying strain-relaxed non-porous layer 100. This means that the quantum wells are lattice matched to the underlying semiconductor structure, which may minimise the strain in the QW layers, increase the Indium incorporation efficiency in the QW layers, and therefore minimise unwanted non-radiative recombination points in the LED.

Figure 7:
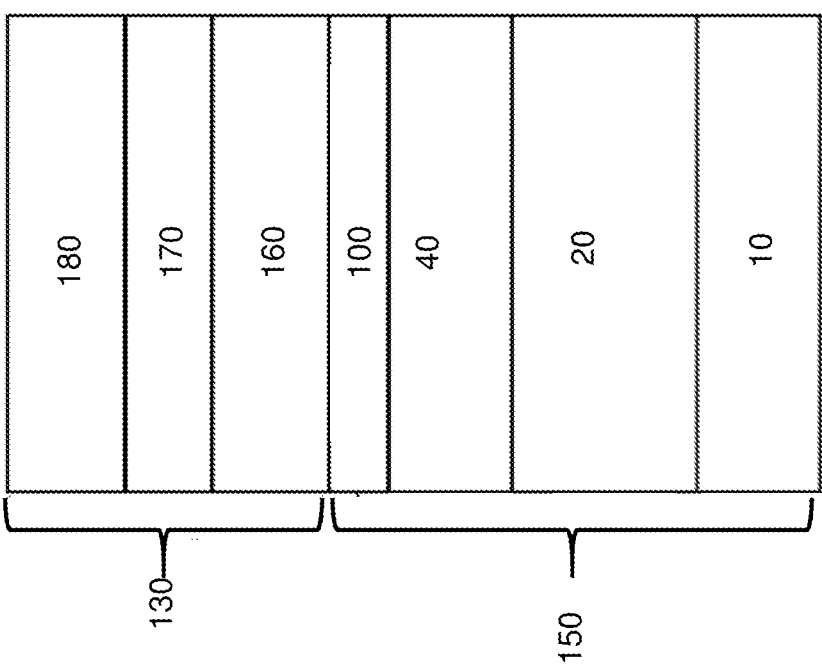
FIGS. 7-12 illustrate a wide range of semiconductor structures and devices which may be provided according to aspects of the present invention.
Figure 7:
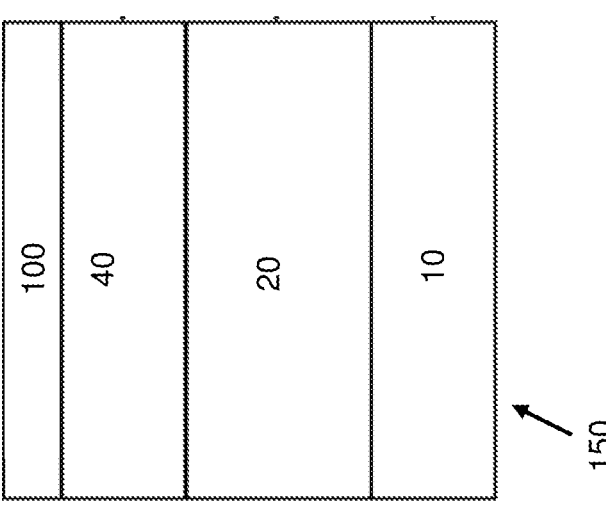

FIG. 7 illustrates another InGaN-based LED device, in which a p-i-n junction comprising InGaN quantum wells is overgrown on a semiconductor structure according to the present invention.

As described in relation to FIGS. 4 and 5, FIG. 7 schematically illustrates a semiconductor structure 150 containing the following layers: a substrate 10, which may be formed from any conventional semiconductor substrate material such as sapphire or silicon, and may have any size; a buffer layer 20 of a first III-nitride material, which is preferably GaN, but alternatively may be (Al,In)GaN, and may have any dislocation density; a porous region 40 of III-nitride material, illustrated as (In)GaN; and a non-porous layer 100 of a second III-nitride material.

The porous region 40 is preferably (In)GaN, and may have any thickness, indium content, and impurity concentration. Prior to porosification, the porous region 40 is heavily n-type doped. The porous region 40 created by electrochemical etching may have any porosity and morphology.

The non-porous layer 100 of second III-nitride material may be (Al,In)GaN of any thickness and doping concentration. This layer is deposited over the porous region 40 after the porosification step, and advantageously inherits a strain-relaxed lattice structure.

The semiconductor structure 150 serves as a template/ substrate for high indium content InGaN and InGaN quantum wells (QWs) and LED structures 130 to be grown on top. This is suitable for LEDs of any colour, such as UV, blue, green and red LEDs with emission wavelengths from around 200 nm to 900 nm. Particularly preferred embodiments are InGaN green LEDs (525 nm emission wavelength) and red LEDs (~615 nm wavelength). An exemplary LED structure 130 is shown as a p-i-n junction made up of an n-doped layer 160 of n-(In)GaN, a light-emitting layer 170 containing at least one InGaN QW, and a p-doped layer 180 of p-(In)GaN.

Figure 8:
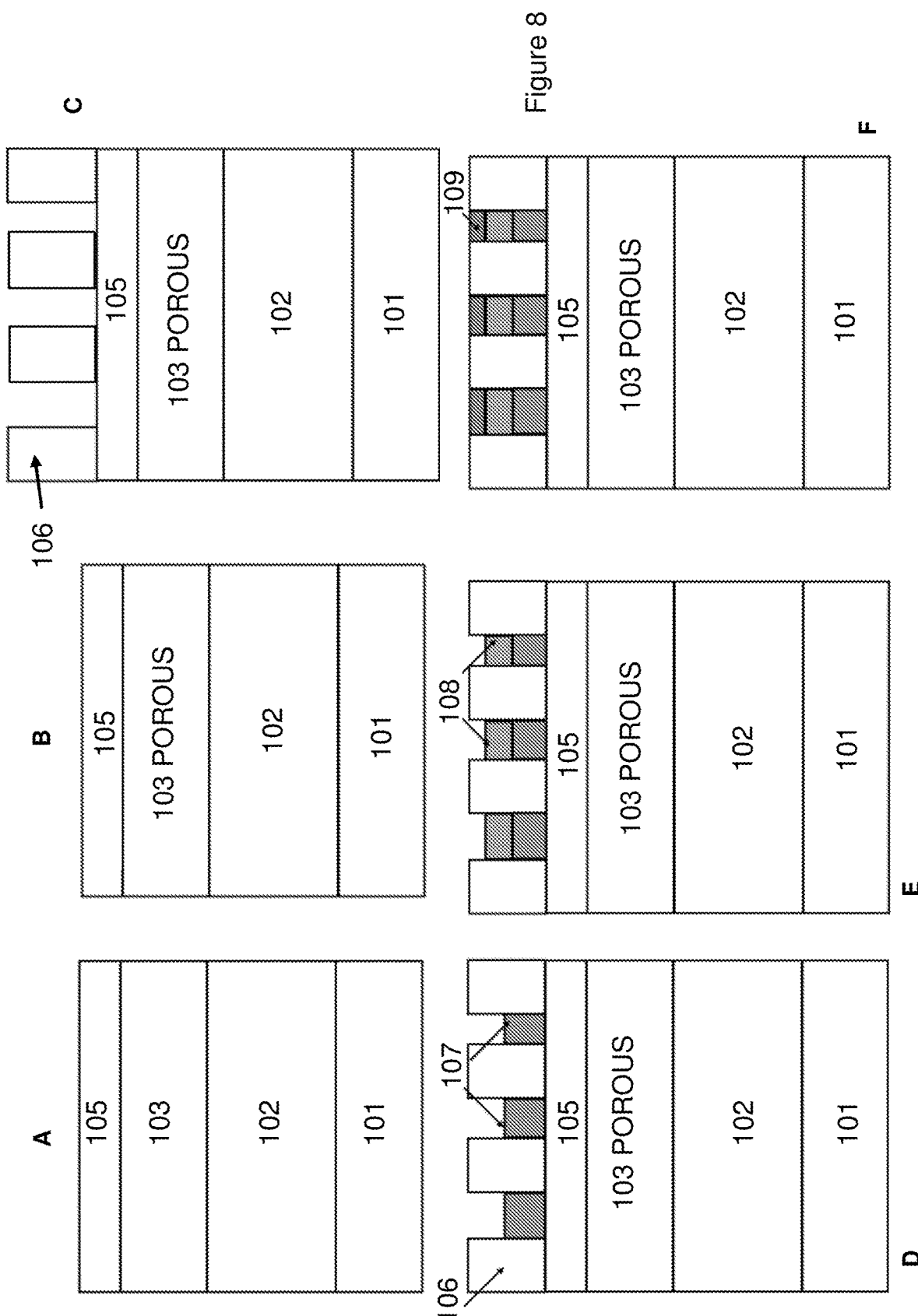

FIG. 8 illustrates the step-by-step processing of a layered semiconductor structure into an InGaN LED structure. This process illustrates the porosification of heavily doped "n++" InGaN into porous InGaN, then the subsequent masking and overgrowth of InGaN quantum wells.

In FIG. 8 step A, a semiconductor structure is provided which contains a layer of heavily doped "n++" InGaN 103 over a substrate 101 and a GaN buffer layer 102, and under an undoped (In)GaN layer 105. The semiconductor structure is porosified by electrochemical etching such that the heavily doped layer 103 becomes porous, as shown in step B, while undoped layers 102, 105 remain non-porous. In step C, the uppermost surface of the intermediate (In)GaN layer 105 is masked with a dielectric material 106, such that three exposed regions remain on the surface of the intermediate (In)GaN layer. As shown in step D, n-doped or undoped InGaN 107 is then deposited in the exposed regions. As the underlying layers are strain-relaxed due to the porosification step, the deposited InGaN 107 is also advantageously strain-relaxed, even though its crystal lattice has different lattice dimensions from the GaN buffer forming the base of the structure. In steps E and F, InGaN QWs 108 and then a layer of p-(In)GaN 109 are deposited over the top of the InGaN, so that these layers form a light-emitting p-i-n junction.

Figure 9:
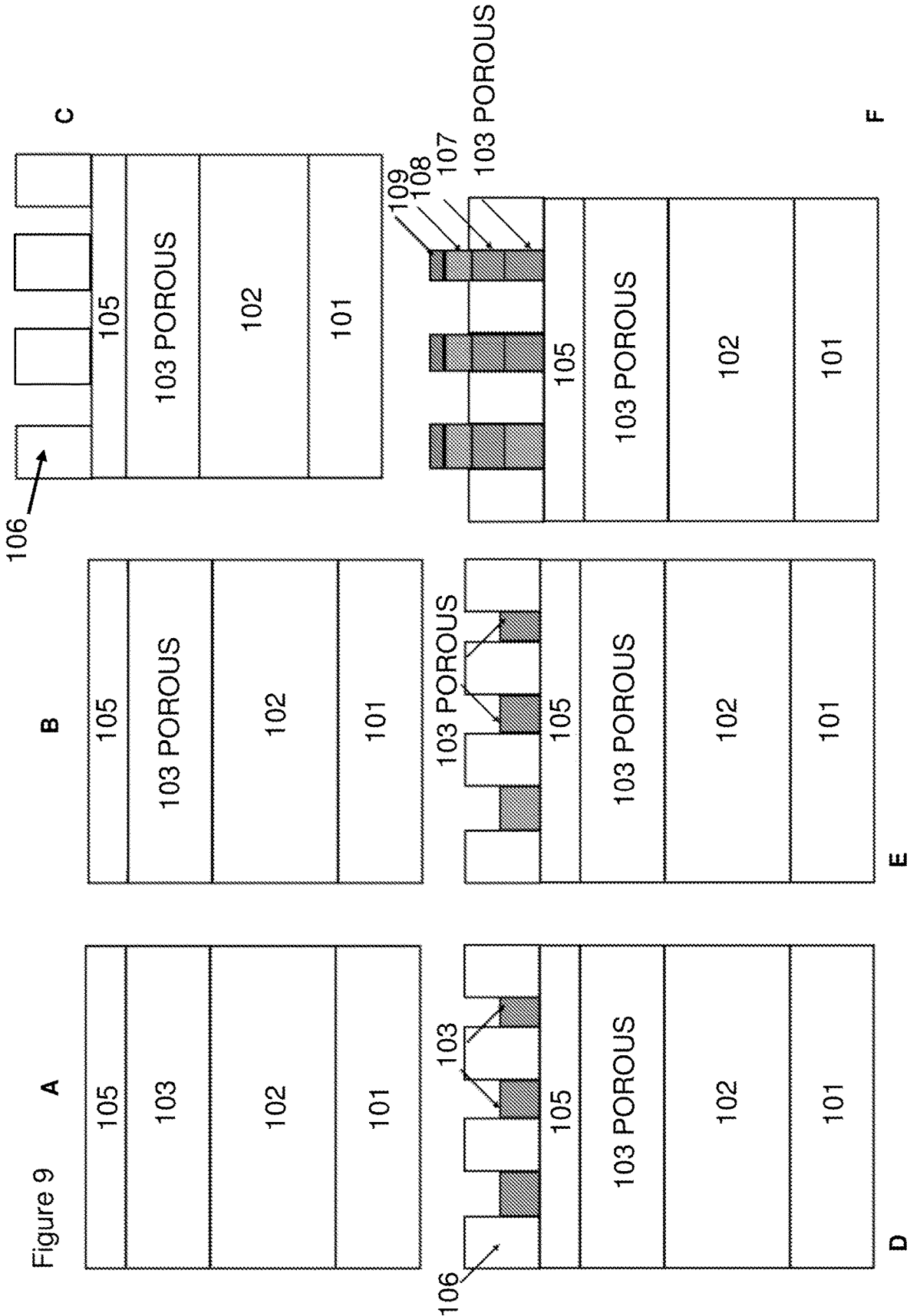
Figure 10:
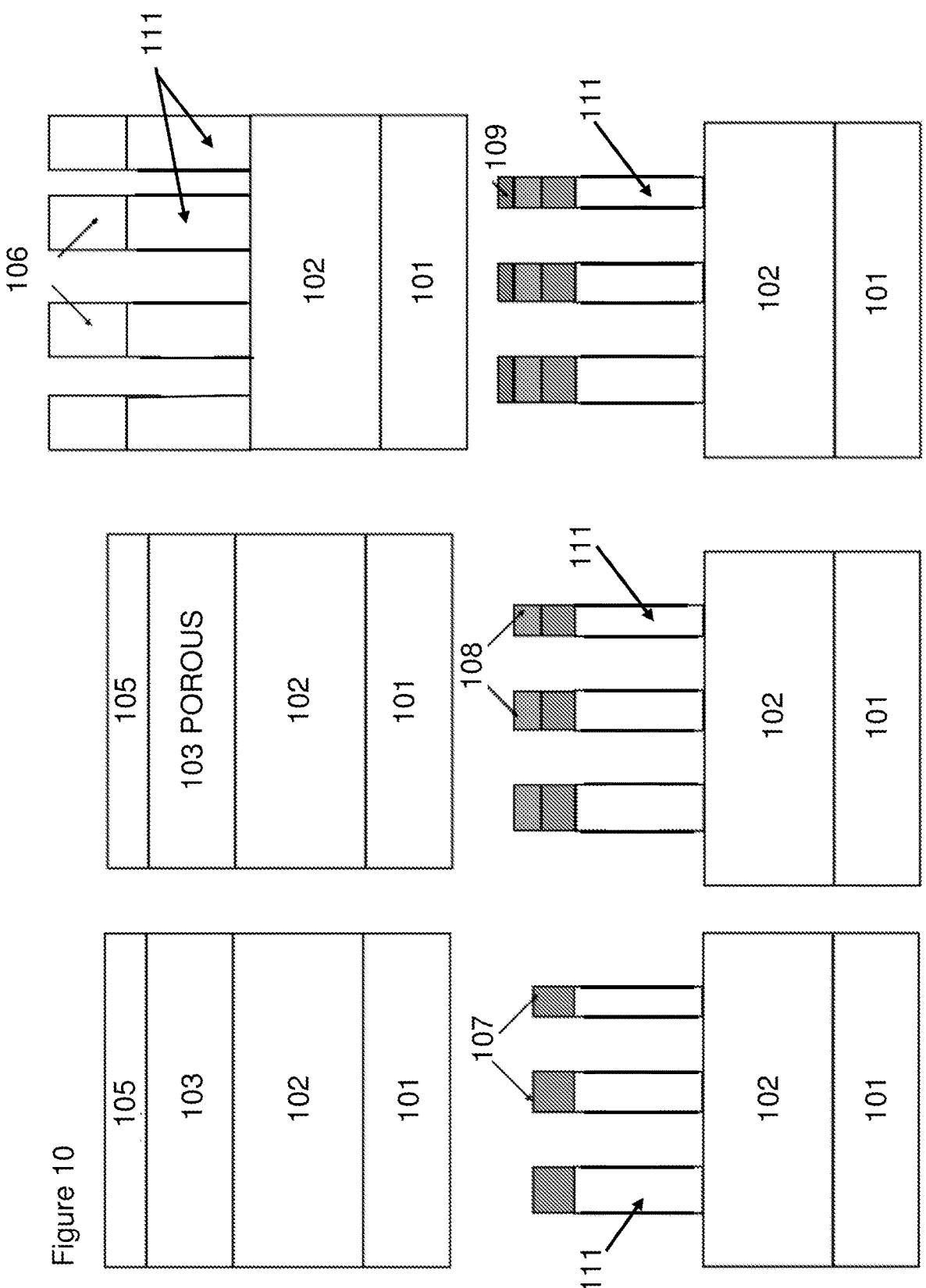

FIG. 9 illustrates the step-by-step processing of a layered semiconductor structure into an InGaN LED structure. FIG. 10 differs from FIG. 9 in the introduction of a further porosification step to porosify the InGaN overgrown onto the non-porous strain relaxed InGaN.

Steps A to D of FIG. 9 are the same as those of FIG. 8. In step E, however, n-doped InGaN 103 is deposited on the exposed regions is porosified by electrochemical etching. As shown in step F, an LED structure of n-(In)GaN 107, InGaN QWs 108 and p-(In)GaN 109 are then overgrown on the porous InGaN 103.

FIG. 10 illustrates the step-by-step processing of a layered semiconductor structure into an InGaN LED structure. This process illustrates the porosification of heavily doped "n++"

InGaN 103 into porous InGaN, then the subsequent patterning of the structure by masking and etching, to create porous InGaN pillars/mesas/stripes 111, which are then overgrown with InGaN quantum well light emitting regions 107, 108, 109.

Figure 11:
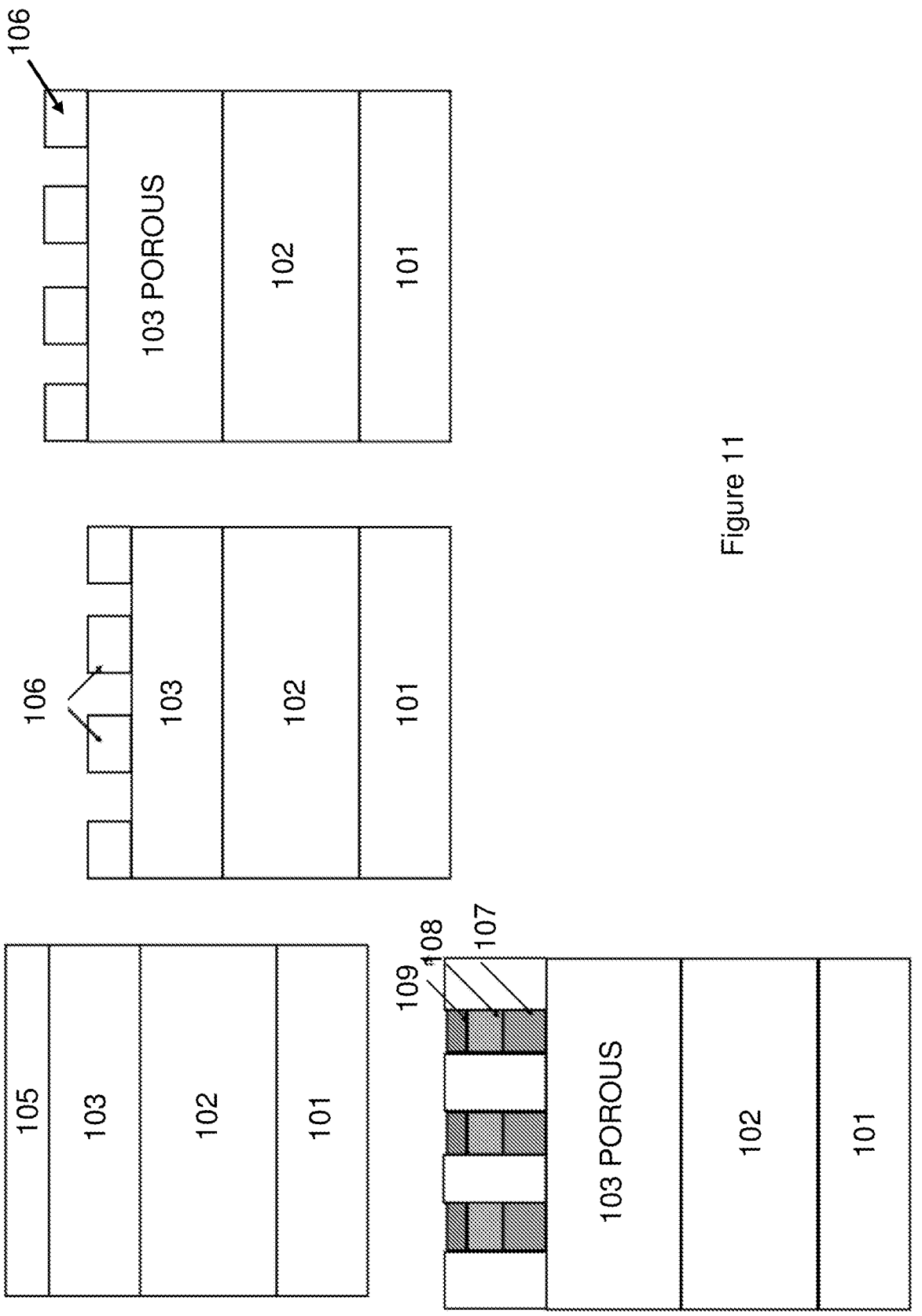

FIG. 11 illustrates the step-by-step processing of a layered semiconductor structure into an InGaN LED structure. This process illustrates the patterning of the non-porous InGaN layer prior to porosification of heavily doped "n++" InGaN 103 into porous InGaN, then the subsequent overgrowth of a light emitting region 107, 108, 109 containing InGaN quantum wells 108.

The patterning of structure can be achieved by any dielectric mask material or any lithography steps. This pattern can also be achieved by in-situ or ex-situ thermal annealing of the (In)GaN layer. After annealing the (In)GaN, which forms a mask for the porosification, the n++ heavily-doped (In)GaN layer is electrochemically porosified into porous (In)GaN. LED structures of n-(In)GaN, InGaN QWs and p-(In)GaN are then overgrown on the patterned porous InGaN.

While these Figures have shown structures and devices based on InGaN, the principles of the present invention are applicable to a range of III-nitride semiconductor devices in which there is a lattice mismatch between layers of different materials.

Possible advantages obtainable with the present invention are:

1. It can be processed at wafer scale, it can be processed using in-situ and ex-situ masks of any material, including InGaN (thermal annealing of a thin InGaN can give mask effect).

2. The overgrowth can be done directly on top of the porous region, or via pattern/openings pre-defined on porous surface.

3. Porosify-twice case (illustrated in FIG. 9): porosify first, then pattern, overgrow, and porosify the overgrown layer(s) again, and overgrow again, either in planar form or nanostructure form with or without a patterning step.

Section 2

A sixth aspect of the present application relates to an improved method of manufacturing semiconductor devices, in particular optoelectronic devices, and to semiconductor devices made using that method.

An aspect of the present application particularly relates to strain relaxation in porous III-nitride semiconductors: using porous InGaN to grow efficient high-In containing device structures.

The semiconductor devices, or LEDs, described in the present application are preferably formed from III-V semiconductor material, particularly preferably from III-nitride semiconductor material.

"III-V" semiconductors include binary, ternary and quaternary alloys of Group III elements, such as Ga, Al and In, with Group V elements, such as N, P, As and Sb), and are of great interest for a number of applications, including optoelectronics.

Of particular interest is the class of semiconductor materials known as "III-nitride" materials, which includes gallium nitride (GaN), indium nitride (InN) and aluminium nitride (AlN), along with their ternary and quaternary alloys (Al,In)GaN. Different crystal orientations may be used in the present invention, such as polar c-plane, non-polar and semi-polar orientations. There are two primary non-polar orientations, a-plane (11-20) and m-plane (1-100). For semi-polar, there are (11-22), {2021} which is a family of crystal planes. III-nitride materials have not only achieved commercial success in solid-state lighting and power electronics, but also exhibit particular advantages for quantum light sources and light-matter interaction.

While a variety of III-nitride materials are commercially interesting, Gallium nitride (GaN) is widely regarded as one of the most important new semiconductor materials, and is of particular interest for a number of applications.

It is known that the introduction of pores into bulk GaN can profoundly affect its material properties (optical, mechanical, electrical, and thermal, etc.). The possibility of tuning the optical properties of GaN by altering its porosity therefore makes porous GaN of great interest for optoelectronic applications.

The present invention will be described by reference to GaN and InGaN, AlGaN, AlN and AlInGaN, but may advantageously be applicable to alternative III-nitride material combinations with lattice mismatches.

In the following description, a template for overgrowth is a semiconductor structure, on which a further semiconductor layer is to be grown in order to result in a semiconductor device. An exemplary template for overgrowth in the present invention may be an InGaN semiconductor structure, comprising multiple layers of doped and undoped InGaN.

Layers of the semiconductor structure may be porosified by electrochemical etching as set out in international patent applications PCT/GB2017/052895 (published as WO2019/063957) and PCT/GB2019/050213 (published as WO2019/145728).

The inventors have found that improved high-In semiconductor structures can be provided using the present invention.

Strain relaxation of an InGaN layer can be achieved by electrochemically porosifying a layer of n-doped InGaN. The porous, strain-relaxed InGaN layer that results from the porosification can then be used as a template on which indium-containing semiconductor devices can be epitaxially grown. The overgrown devices are inherently strain-relaxed because they are grown on a strain-relaxed template, which allows the growth of efficient longer wavelength light emission structures that have previously challenging to achieve.

The main benefit is for indium-containing light-emitting device structures, especially for longer wavelength devices. e.g longer than 520 nm.

A substrate is usually the starting point on which an epitaxy layer is grown. The substrate can be Sapphire, Silicon, bulk GaN, SiC. The crystal orientation for the overgrowth can be c-plane, non-polar or semi polar.

A template is defined as a substrate having pre-existing epitaxy layers and is used for subsequent processing or overgrowth. A template may also be called a pseudo-substrate.

Information on Epitaxy Structure for the Template

A multi-layer semiconductor structure (which may be termed an "epitaxy structure") is grown on top of a substrate (for example sapphire). Once the epitaxy structure has been grown on the substrate the resulting structure can be termed a "template". The template needs to have a specific epitaxy structure (defined by the specifications of thickness and doping), so that this can be used for porosification afterwards, and subsequent overgrowth of In-containing layers.

Various features of a strain-relaxes semiconductor "template" for overgrowth of semiconductor device structures are described above in relation to the first aspect of the invention. Such a template preferably comprises a porous region of III-nitride material, or a stack of alternating porous and non-porous layers of III-nitride material, grown over a substrate. The porous region(s) may preferably be formed from GaN, or InGaN, or a combination of GaN and InGaN. The porous regions are preferably deposited as highly n+ doped layers, and electrochemically porosified to selectively create pores in n+ regions of the template, while leaving undoped layers intact and non-porous.

Particularly preferably, the semiconductor structure may advantageously comprise an intermediate layer of InGaN above the porous region of III-nitride material. The intermediate layer of InGaN is preferably grown over the porous region before any device structure is deposited on the template.

The substrate may have AlGaN, GaN, InGaN or a combination of both (Al)GaN and InGaN layers grown on it with different compositions and thicknesses.

A doped or undoped GaN layer may have a thickness of anywhere between 100 nm-3000 nm or even thicker. This GaN layer can be in the form of a bulk layer with uniform doping throughout the thickness (doping range $1 \times 10^{17}$ to $1 \times 10^{20}$). If the GaN layer is to be porosified to form the porous region of the template, at least a portion of the GaN layer must be n-type doped.

The GaN layer may be in the form of stack of alternating doped and undoped layers. The thickness of doped layers can be anywhere between 1 nm-500 nm, preferably 20 nm-500 nm. The thickness of un-doped layers can be anywhere between 1 nm-250 nm. When such a stack is electrochemically porosified, only the doped layers are made porous.

Instead of, or in addition to a GaN layer, the template may optionally comprise an InGaN layer.

The InGaN layer can optionally be grown on an undoped GaN layer.

The InGaN layer can be in the form of single bulk layer of InGaN, or may alternatively comprise a stack of InGaN/GaN alternating layers or a stack of InGaN/InGaN alternating layers.

The InGaN layer can be undoped or n-doped intentionally with silicon or germanium or unintentionally with oxygen, with a doping range between $1 \times 10^{17}$ to $1 \times 10^{20}$ cm$^{-3}$. If the InGaN layer is to be porosified to form the porous region of the template, at least a portion of the InGaN layer must be n-type doped.

The InGaN layer can be between 1-400 nm thick, preferably between 20-400 nm thick.

As general rule the In % and layer thickness of the InGaN layer are inversely related. For layers with increasing atomic indium contents (In %), the layer thickness may be reduced to maintain the layer quality.

The InGaN layer may contain an atomic indium content of between 1%-25%, preferably 5%-13%, particularly preferably 7%-11%. In a certain scenario, the In % can be lower in the start (the lower side of the layer, nearer the substrate) of the InGaN layer and ramped up to higher levels in the top side (nearer the surface which will be overgrown with a device structure). Indium composition may be changed as the InGaN or stack of InGaN is grown.

These GaN and InGaN layers can be used separately or used in combination to make multi-layered semiconductor templates that can be used for porosification.

Once a suitable template has been grown on the substrate, the n-doped portions of the above-mentioned GaN and/or InGaN layers are porosified using electrochemical etching (ECE). The % of porosity may be between 10-90% in porosified doped layers, preferably 20-75% porosity.

Prior publications relating to the porosification of III-V semiconductor material include international patent applications PCT/GB2017/052895 (published as WO2019/063957) and PCT/GB2019/050213 (published as WO2019/145728).

The electrochemical etching process parameters can be taken from WO2019/063957 or WO2019/145728. General etching Voltage range is between 0.1-30 V, and can be continuous or pulsed, while temperature can be between −25-60 degrees Celsius.

In preferred embodiments, the template may comprise a top layer of InGaN which is not doped, and which is therefore not electrochemically porosified. The porosified GaN or InGaN structure may be embedded below the top layer of the template. The non-porous top InGaN layer may thus be a capping layer that serves as a good starting point for regrowth.

If the top layer is porosified then a further layer of III-nitride material, preferably InGaN, may be deposited over the porous top layer to form a continuous and uniform layer is preferred before the device structure is grown.

Figure 12:
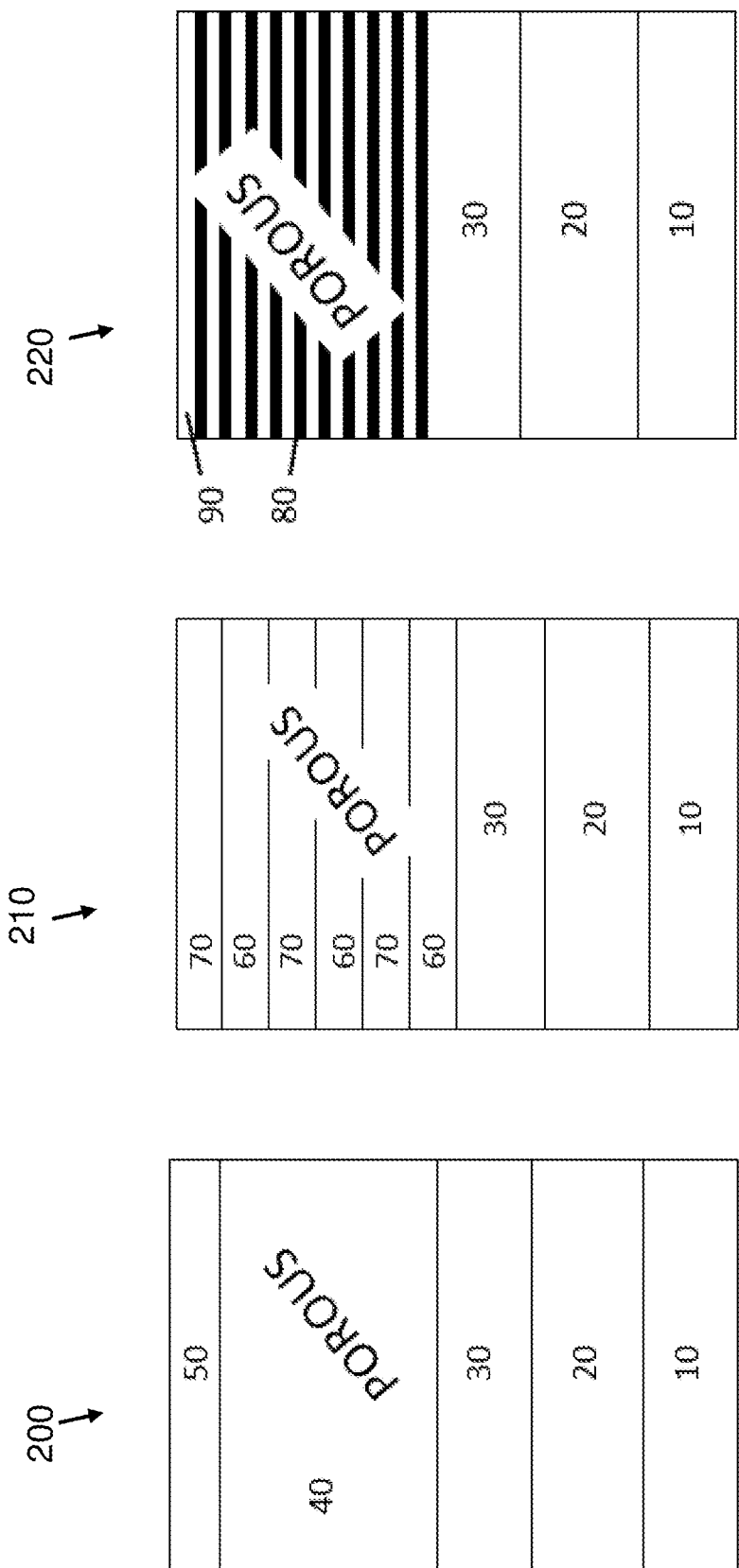
Figure 13:
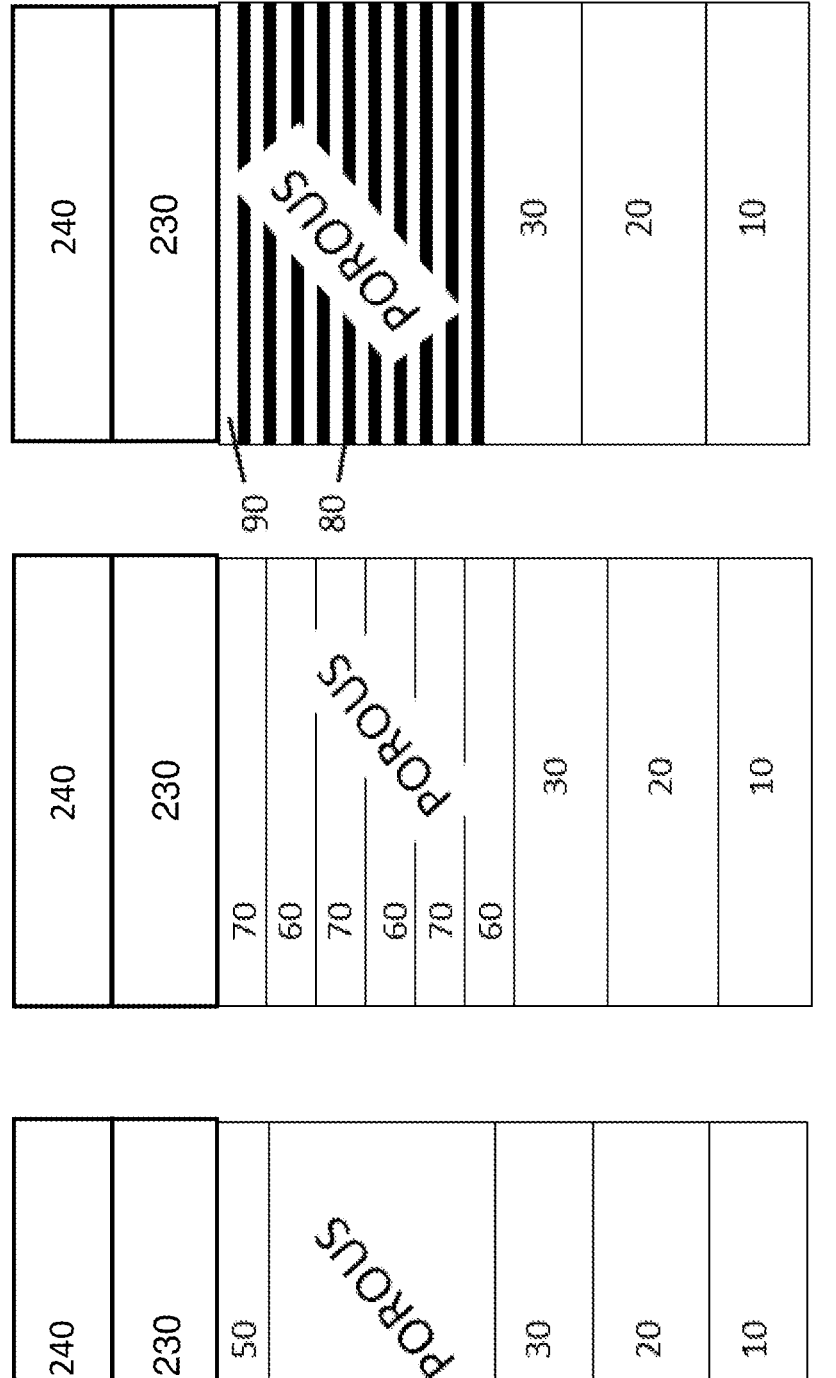

FIG. 12 shows three exemplary porous semiconductor structures, which are the structures of FIG. 4 following electrochemical porosification; and FIG. 13 shows the three semiconductor structures of FIG. 12, following epitaxial overgrowth of an intermediate InGaN layer 230 and a device structure 240 onto the uppermost layer of the semiconductor structure.

As described above, the InGaN layers in the illustrated examples may contain a variety of compositions and indium contents, for example preferably 3%-11% indium. In these three particular embodiments (shown in the Figures for the sake of example only) the InGaN layers 40, 50, 60, 70 contain 11% Indium, or are provided as alternating InGaN layers 90, 80 containing 7% and 11% indium respectively.

In FIG. 12, the left hand porous template 200 has the following multi-layer structure (from bottom to top):

Silicon/Sapphire substrate 10;
1-2 micron GaN buffer 20;
~250 nm undoped GaN 30;
250 nm n+ doped $In_{0.11}GaN$ 40 (porosified during electrochemical etching);
50 nm undoped $In_{0.11}GaN$ 50 (not porosified during electrochemical etching).

In FIG. 12, the central porous template 210 has the following multi-layer structure (from bottom to top):

Silicon/Sapphire substrate 10;
1-2 micron GaN buffer 20;
~250 nm undoped GaN 30;
50 nm n+ doped $In_{0.11}GaN$ 60 (porosified during electrochemical etching);
50 nm undoped $In_{0.11}GaN$ 70 (not porosified during electrochemical etching);
50 nm n+ doped $In_{0.11}GaN$ 60 (porosified during electrochemical etching);
50 nm undoped $In_{0.11}GaN$ 70 (not porosified during electrochemical etching);
50 nm n+ doped $In_{0.11}GaN$ 60 (porosified during electrochemical etching);
50 nm undoped $In_{0.11}GaN$ 70 (not porosified during electrochemical etching).

In FIG. 12, the right hand porous template 220 has the following multi-layer structure (from bottom to top):

Silicon/Sapphire substrate 10;
1-2 micron GaN buffer 20;
~250 nm undoped GaN 30;
10 pairs, 400 nm thick stack: 10×(20 nm n+ doped $In_{0.11}GaN$ 80 (porosified during electrochemical etching) and 20 nm undoped $In_{0.07}GaN$ 90 (not porosified during electrochemical etching))

In particularly preferred embodiments, the device structures 240 of FIG. 13 can be an LED or a laser epitaxy structure.

Before the device growth, an intermediate InGaN layer 230 (containing 0-10% indium) is overgrown on the porous template 200, 210, 220.

The indium percentage of the intermediate InGaN layer 230 can be 1.2-8 times less than the indium content of the QWs in the overgrown device structure 240. The thickness of the intermediate InGaN layer 230 may be anywhere between 1.5-10 times less than that of the QW stack.

In preferred embodiments in which the device structure 240 is an LED structure, the LED structure may contain: n-doped GaN or n-doped InGaN layer, single or multiple quantum wells (3, 5 or 7 QWs), AlGaN electron blocking layer, and a p-GaN or p-InGaN layer.

In preferred embodiments in which the device structure 240 is a laser structure, the laser structure may contain: doped n-GaN, AlGaN cladding layer (0-10% Al), n-doped GaN or InGaN (1-10% In) waveguiding layer, quantum wells (1-5 QWs), p doped waveguiding layer GaN or InGaN (1-10% In), p-doped AlGaN cladding (1-10% Al).

Achieving strain relaxation in InGaN layer(s) via porosification advantageously helps in growing efficient longer wavelength light emission structures. The longer wavelength can be between 520 nm-670 nm.

The desired emission wavelength of the device governs the type (bulk or alternating stack of layers), thickness, Indium % of the InGaN layers, and % porosity that is required to achieve a certain degree of relaxation.

Section 3

Strain compliant porous III-nitride semiconductors: How to grow on porous InGaN templates to achieve wavelength shift.

The present invention provides a semiconductor structure comprising:

a semiconductor substrate or template comprising an upper layer of porous InGaN;
an intermediate layer of non-porous InGaN on top of the upper layer of porous InGaN; and
a semiconductor device on top of the intermediate layer of non-porous InGaN.

The semiconductor device preferably comprises InGaN, particularly preferably InGaN/(In)GaN quantum wells. The semiconductor device is preferably a light-emitting semiconductor device, such as an LED or a laser device.

The semiconductor structure may be made by porosifying the InGaN layer in the semiconductor template, then epitaxially growing the intermediate layer onto the porous substrate, then epitaxially growing the semiconductor device onto the intermediate layer.

As described above, porosifying the InGaN layer in the substrate/template leads to a reduction in lattice strain. The overgrown intermediate layer and device are therefore strain-relaxed. This may advantageously lead to a wavelength shift in the emission wavelength of the semiconductor device towards wavelengths that have been difficult to achieve with conventional semiconductor manufacturing methods.

A template is defined as a substrate having pre-existing epitaxy layers and is used for subsequent processing or overgrowth. A template may also be called a pseudo-substrate.

Information on epitaxy structure for the template is set out in Section 2, above.

This section focuses on the techniques to grow on top of a porous InGaN template.

The epitaxy layer design and porosification process details can be as described above.

An intermediate GaN or InGaN layer (with 0.1-10% Indium) may be required to grow on surface or sub-surface porous templates before growing the quantum well based devices.

Shown below are some technical data from experiments done to achieve wavelength shift.

As described above, FIG. 12 shows three exemplary porous semiconductor structures which are strain compliant porous InGaN substrates/templates.

Figure 14:
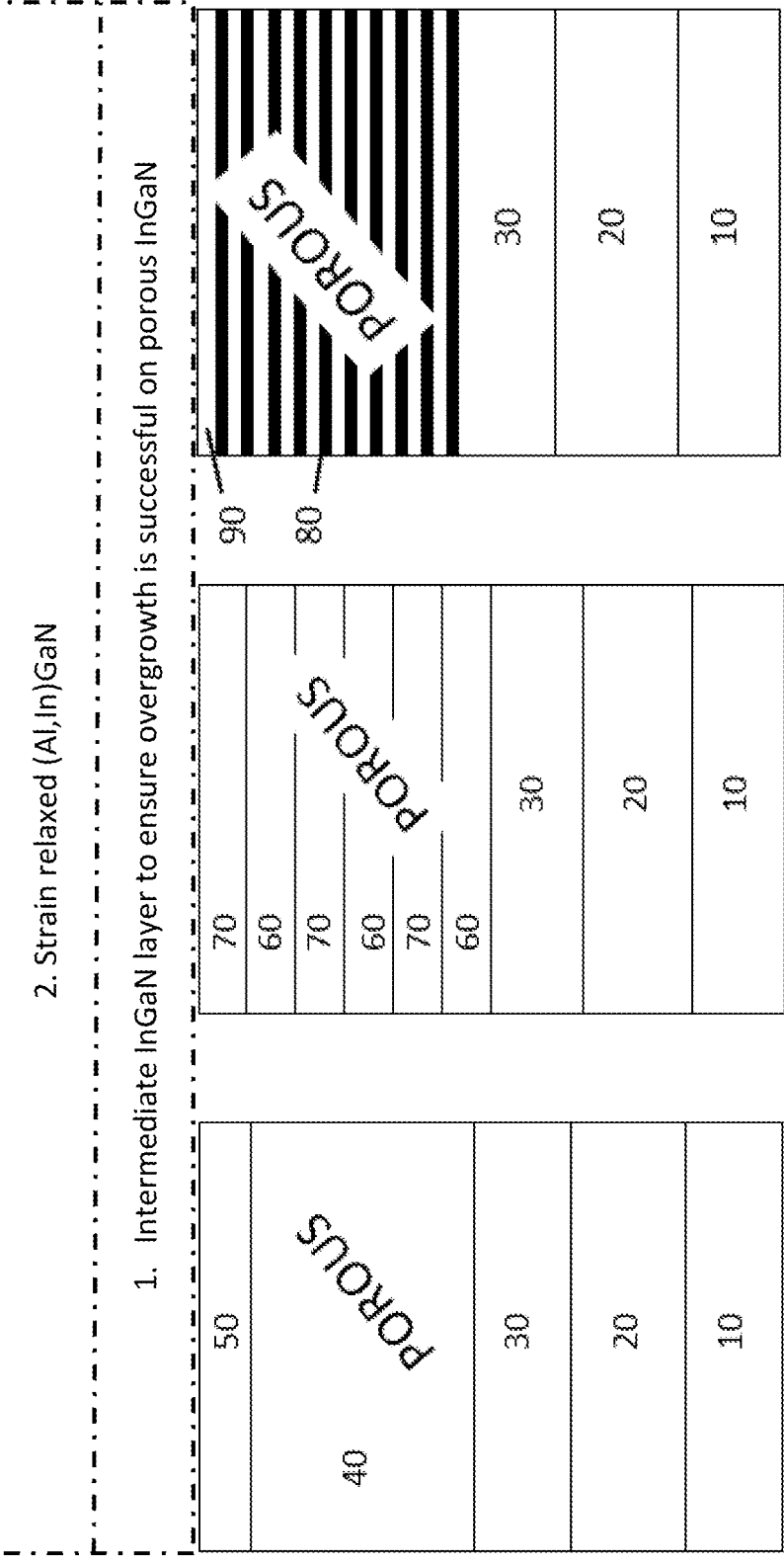

FIG. 14 shows the three semiconductor structures of FIG. 12, following epitaxial overgrowth of an intermediate InGaN layer onto the uppermost layer of the semiconductor structure, and overgrowth of a strain relaxed (Al,In)GaN layer(s) (optionally AlGaN, InGaN, or GaN) on top of the intermediate InGaN layer.

Figures 15A, 15B:
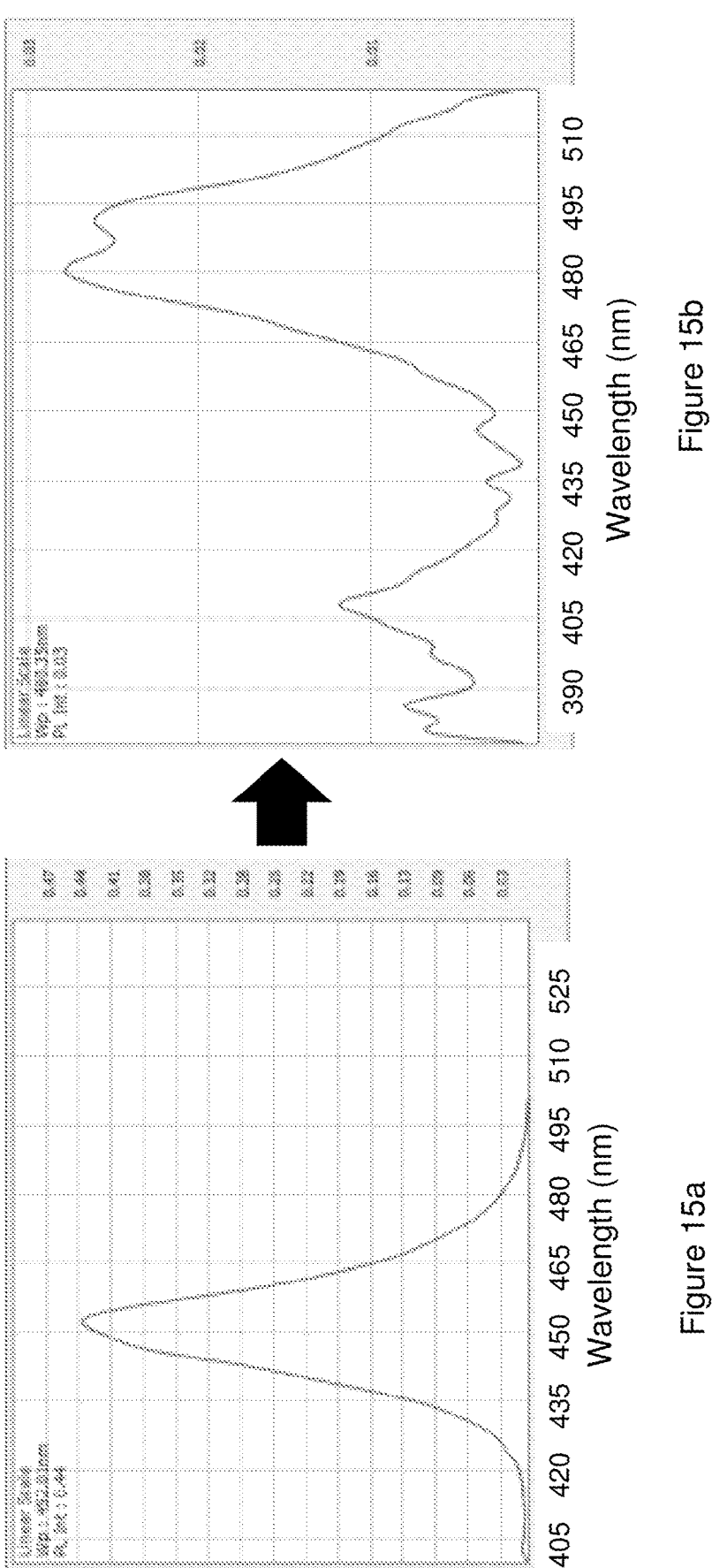

FIG. 15a shows Photoluminescence from Quantum Wells grown on a GaN template without a porous region that provides strain reduction in the semiconductor lattice, and FIG. 15b shows Photoluminescence from identical Quantum Wells grown on a porous InGaN template according to the present invention.

The intermediate layer (which is the starting epitaxy layer in regrowth step) on the porous InGaN template can be an InGaN layer with 0-10% Indium content.

The percentage and thickness of Indium is coupled with the Indium % in the QWs of a particular light emitting structure.

The general formula for coupling can be:

The intermediate InGaN layer can be a bulk layer or a stack of layers and can have 1.2-8 times less indium content than the QWs in the device structure. The thickness of intermediate InGaN layer can be anywhere between 1.5-10 times less that the QW stack.

The above boundary conditions for the intermediate layer are important for achieving a reasonable surface quality for subsequent QW growth to achieve the wavelength shift.

FIGS. 15a and 15b show that growing quantum wells (QWs) on a strain-relaxed InGaN template creates a wavelength shift in the emission spectrum of the QWs. Optimised epitaxy overgrowth is indicated by PL emission.

FIG. 15a shows the reference structure without any porosification.

FIG. 15b shows the PL emission from a structure where the underlying InGaN layer or stack of InGaN layers has been porosified, and the InGaN interlayer is grown to achieve the emission from QWs.

The observance of PL emission from QWs grown on porosified structure shows that the porous region and the interlayer create a shift in the optical emission wavelength of an LED structure grown on the template.

The wavelength shift shows that strain relaxation from porous regions works.

Section 4

LED with strain compliant porous III-nitride semiconductors (for a single wavelength LED).

Multistep strain relaxation+single narrow wavelength for LED.

This section focuses on multistep strain relaxation along with structures fine-tuned for light emission at a single wavelength.

The substrate can be Sapphire, Silicon, bulk GaN, SiC. The crystal orientation for the overgrowth can be c-plane, non-polar or semi polar.

Figures 17, 18, 19:
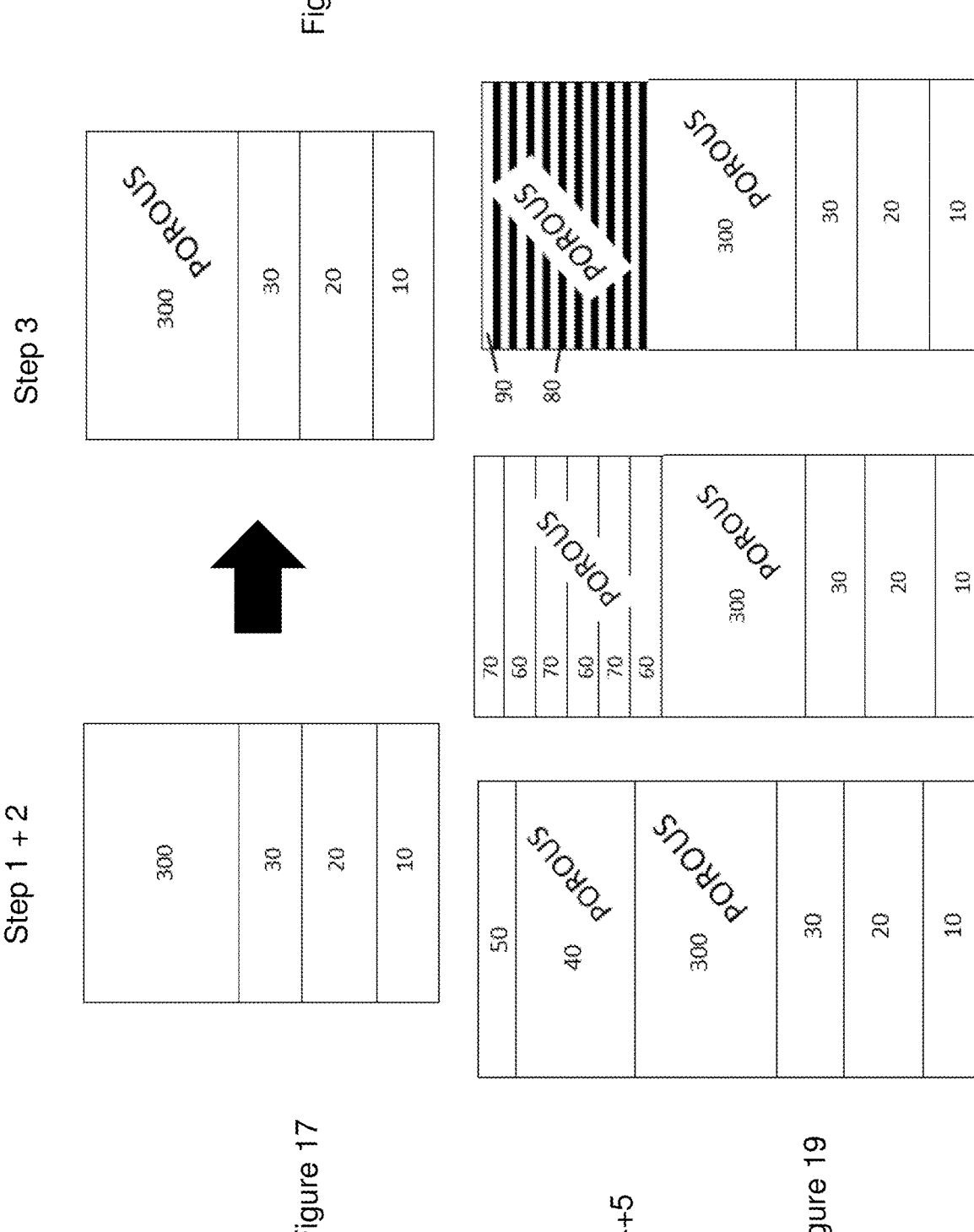

FIGS. 17-19 illustrate the growth of a suitable template, and further processing steps, as follows:

Step 1: The epitaxy structure can comprise a 1-2 μm GaN buffer layer 20 along with a 250 nm thick layer of GaN 30 which can be doped or undoped.

Step 2: On top of it a stack 300 of alternating doped/undoped layers (GaN or InGaN) is grown. (Suitable thicknesses and doping conditions are set out above, and in WO2019/063957 or WO2019/145728). The stack 300 of doped/undoped layers may be a stack of alternating layers of GaN/GaN, or GaN/InGaN, or InGaN/InGaN, and is covered with a 50-200 nm thick cap layer of non-doped GaN or InGaN.

Step 3: The next step is electrochemical porosification of the n-doped layers in the stack 300 to make a Distributed Bragg Reflector (DBR), as is known from WO2019/063957 and WO2019/145728. The thicknesses of the layers are selected in the epitaxy growth stage so that after porosification the final structure acts as a mirror for a certain wavelength. This wavelength can be in the range of 400-675 nm, for example, and may be tuned as desired by selecting appropriate layer thicknesses and porosities in the stack.

Step 4: For longer wavelength devices e.g >520 nm, a bulk InGaN layer 40, or a stack of InGaN/GaN or InGaN/InGaN layers 60, 70, 80, 90, is overgrown on top of the porous template produced by Step 3.

Step 5: Porosification of the n-doped layer or n-doped portions of the stack of layers overgrown in step 4.

Step 6: Overgrowth of a light-emitting semiconductor device structure, preferably a long-wavelength LED structure.

As a first part of Step 6, an intermediate layer of non-porous InGaN may be overgrown onto the top layer of the porosified template of Step 5, so that the device structure is overgrown onto the intermediate layer. Strain-relaxed InGaN/(In)GaN quantum wells and an LED structure may be overgrown onto the template produced by Step 5.

Light emitting semiconductor devices with emission wavelengths between 400-675 nm may be overgrown onto a template produced using this sequence of steps.

Explanation

The primary aim of the first porosification is making a DBR or an optical filter for a particular wavelength. The provision of a DBR or optical filter in the template creates a very narrow emission peak for the light emitting semiconductor device, as the DBR or bandpass filter selectively reflects or transmit only a narrow wavelength range. The porosification process also helps strain relaxation to some extent but the structure is not optimised for strain relaxation.

The primary aim of the second porosification is to focus on strain relaxation.

The combined structure of DBR+strain relaxation can be useful for growing long wavelength III-nitride devices with a narrow emission peak. The invention tries to address the well known issue of broadening of spectral linewidth caused by alloy disorder, especially for high indium containing quantum wells. The DBR can be tuned for maximising spectral emission reflection at a certain wavelength while the porous InGaN structure will help in achieving longer wavelengths.

As described above, FIG. 12 shows three exemplary porous semiconductor structures 200, 210, 220 usable as templates for overgrowth.

Figure 16:
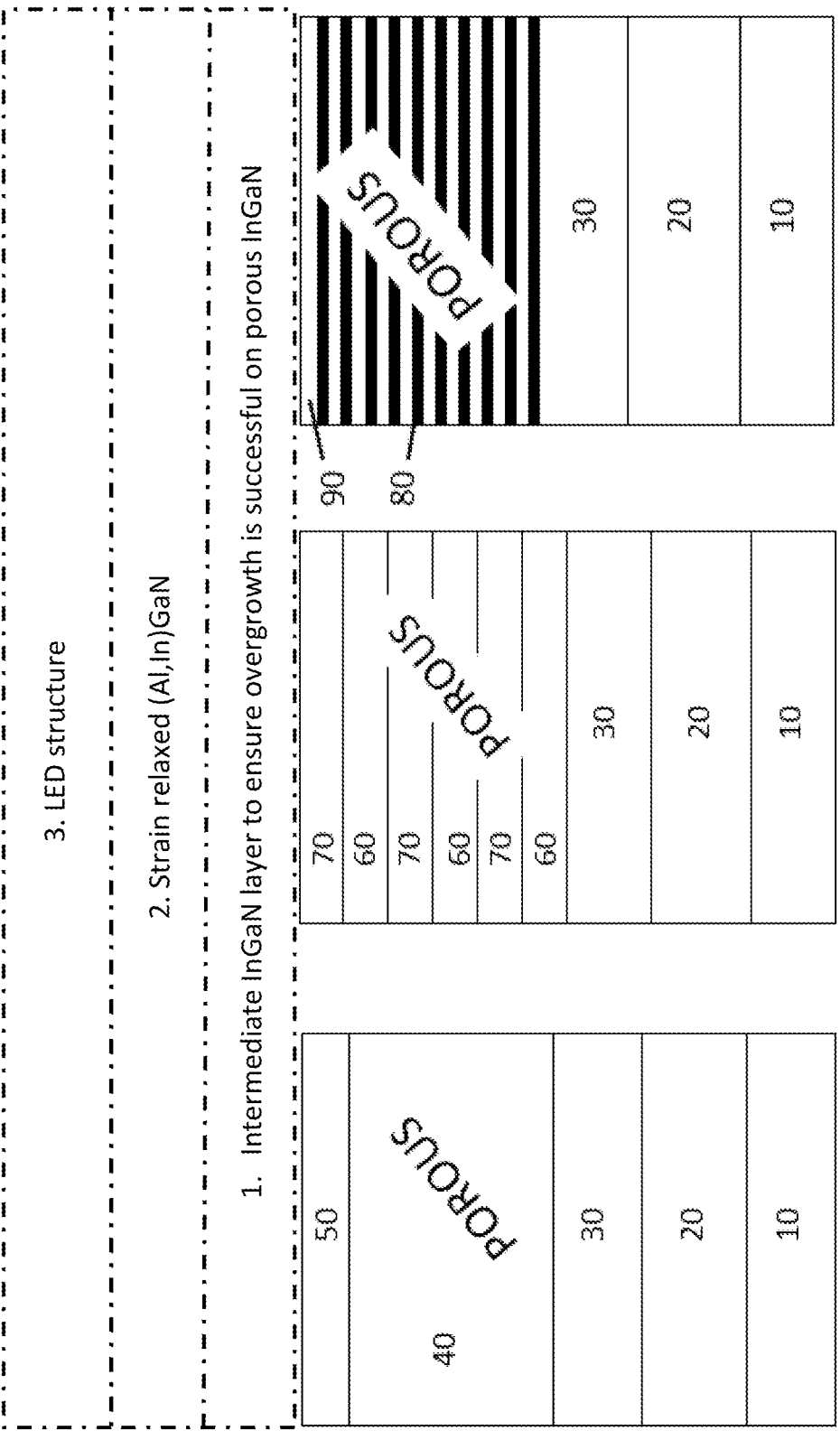

FIG. 16 shows the three semiconductor structures of FIG. 12, following epitaxial overgrowth of an intermediate InGaN layer, strain relaxed (Al,In)GaN layer(s) (optionally AlGaN, InGaN, or GaN), and an LED structure. The alternating layers are undoped $In_{0.11}GaN$ 20 nm (90 in FIG. 16) and n+ doped $In_{0.07}GaN$ 20 nm (80 in FIG. 16).

FIGS. 17 and 18 illustrate Steps 1, 2 and 3 of the method above.

FIG. 19 illustrates three exemplary semiconductor structures that can be made by Steps 4 and 5 of the method above.

Before the device growth, the structure may have an intermediate InGaN layer (with 0-10% indium). The indium percentage can be 1.2-8 times less when comparing to QWs in the overgrown device structure. The thickness of intermediate InGaN layer can be anywhere between 1.5-10 times less that the QW stack.

Figure 20:
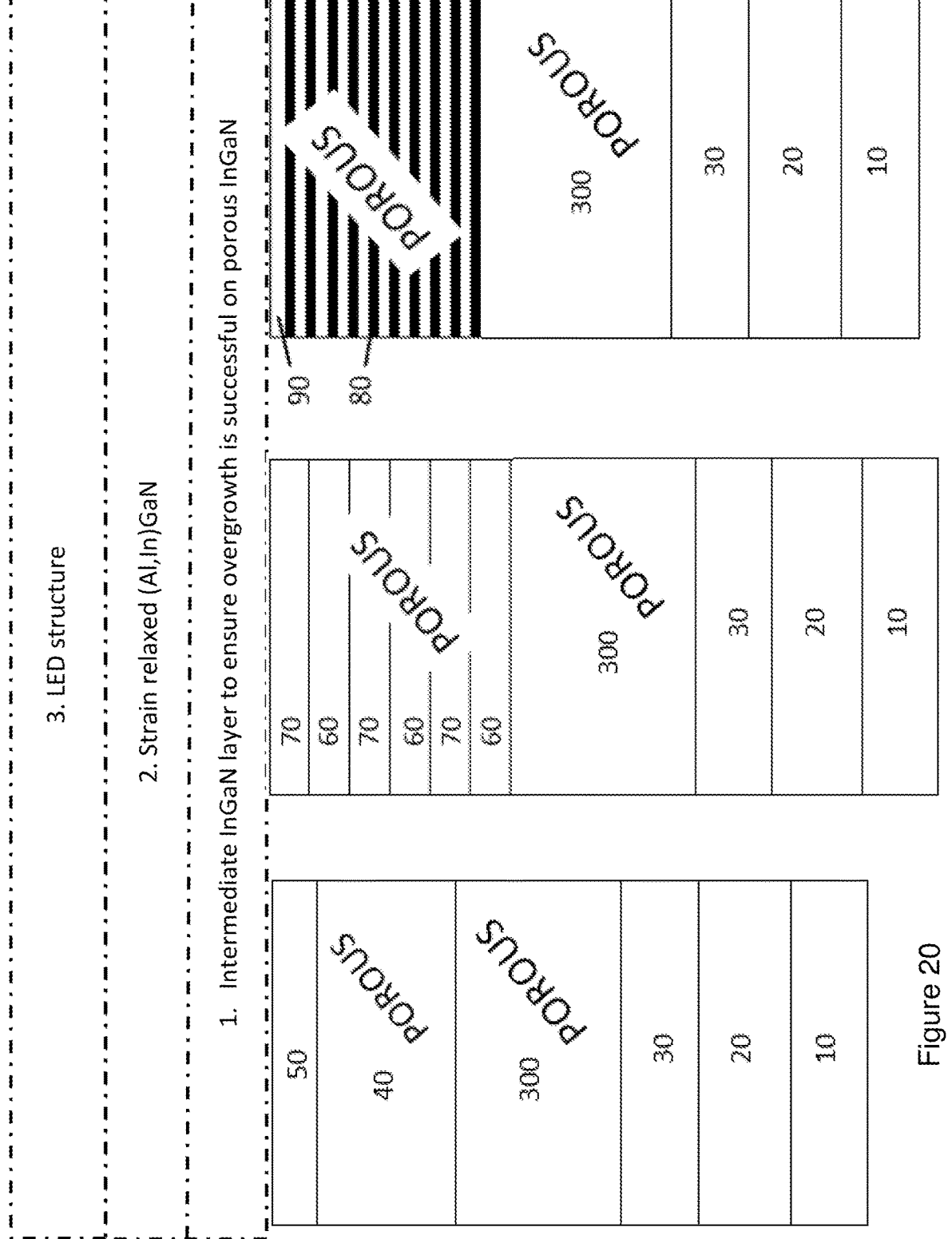

FIG. 20 illustrates the structures of FIG. 19, overgrown with an intermediate InGaN layer, strain relaxed (Al,In)GaN layer(s) (optionally AlGaN, InGaN, or GaN), and an LED structure.

Section 5

Strain compliant porous III-nitride semiconductors and micro/nano structuring for overgrowth.

Gallium nitride is successfully used for blue LEDs for many applications, but longer wavelength emitters in the green, amber and particularly red are difficult to achieve at appropriate efficiencies in this materials system. One of the big challenges facing the growth of long wavelength LEDs on GaN-based platforms is the requirement to use high indium contents to reduce the bandgap in the active region to an appropriate level. The required InGaN active regions have a larger lattice dimension than the underlying GaN and the resulting strain leads to the formation of defects in the material which act as non-radiative recombination centres deteriorating device performance.

High quality InGaN (with high Indium content>20%) is difficult to achieve, due to the large lattice mismatch between InN and GaN. The misfit strain also results in a reduced indium composition through the composition pulling effect.

As described above, a relaxed InGaN buffer layer reduces lattice mismatch between the GaN buffer and InGaN quantum wells, which is highly desirable and necessary for achieving long wavelength (>500 nm) III-nitride light emitting devices.

Porous (In)GaN can be used to provide a compliant layer for the overgrowth of strain relaxed InGaN, allowing the formation of structures of higher indium content without the build-up of damaging levels of strain.

Strain relaxation/strain compliance using porous technology may involve multiple porosification steps, pre-patterning and post-overgrowth of planar and 3-dimensional (In) GaN structures to allow further local strain relaxation (uniaxial and bi-axial).

For example, a thick InGaN layer is normally fully strained on GaN, and due to lattice mismatch between the GaN and InGaN lattices, defects will generate. As described above, by providing a porous region or stack of porous regions beneath a layer of InGaN, the strain in the lattice is relaxed, so that the InGaN QWs that are subsequently overgrown will then be lattice matched to this relaxed InGaN. In other words, preparing an InGaN 'template' or 'substrate' that is relaxed and has similar lattice dimensions to the high indium content InGaN QWs is highly advantageous, and is particularly useful for long wavelength LEDs containing high indium contents.

As shown in the Figures, there are many options for preparing the underlying (In)GaN stack, which is porosified by known electrochemical etching processes.

This underlying porous (In)GaN can be usedas a template for further overgrowth of InGaN, which is going to be relaxed for high indium content InGaN QWs to grown upon with a reduced lattice mismatch. This template can be also patterned to allow 3D nanostructures/pillars/pyramids/stripes/disks to be grown, which may advantageously allow further strain relaxation.

This underlying porous template may also be patterned into different shapes and geometry, in which case the combination of porous region(s) and patterning may advantageously allow significant strain relaxation for overgrown (In)GaN, onto which high indium content QWs will be grown.

Epitaxy structures that are suitable for templates for overgrowth are described in the sections above.

Epitaxy structures for porosification can be designed as:
1. GaN layer
2. InGaN layer
3. InGaN/GaN or InGaN/InGaN (thick)
4. InGaN/GaN or InGaN/InGaN (thin)
5. Composition graded InGaN/GaN or InGaN/InGaN
6. A thin InGaN grown on InGaN/GaN template such that, following an in-situ treatment, the InGaN can transform into some network finger-like structures, which can be used as a natural mask for porosification of the thick InGaN underneath. This way, we can create 3D structures and isolated porous regions in this template, which will be used for further overgrowth and relax the InGaN grown above.

As described above, FIG. 4 shows exemplary semiconductor structures prior to porosification, and FIG. 12 shows the same semiconductor structures 200, 210, 220 following porosification.

FIGS. 21A, 21B and 21C show the semiconductor structures of FIGS. 4 and 12 following electrochemical porosification and subsequent overgrowth of a variety of structures comprising strain relaxed InGaN.

Figures 22A, 22B, 22C:
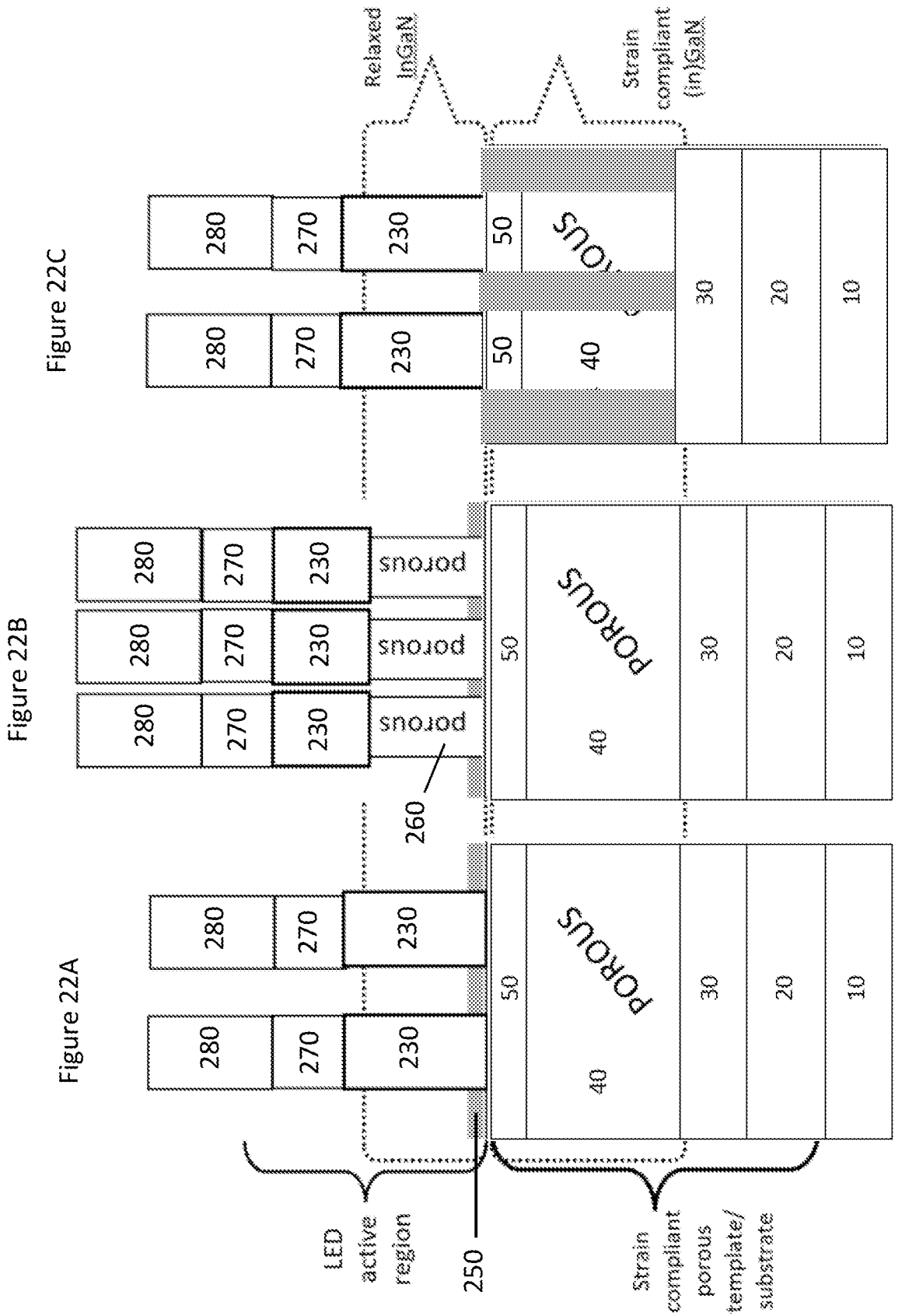

FIG. 21A shows a semiconductor structure formed by the steps of: Masking of porous InGaN template 200 with a mask 250 through which there are micro/nano openings; InGaN interlayer overgrowth is done within the mask free areas. The semiconductor structure of FIG. 22A is formed by applying a dielectric mask 250 to the uppermost surface of the template 200, and creating two openings in the mask 250 to expose two regions on the surface of the template. The InGaN interlayer 230 is then overgrown only in the exposed, mask-free regions.

FIG. 21B shows a semiconductor structure formed by the steps of: Masking of porous InGaN template 210 with micro/nano openings in the mask 250; Re-Growth of structures 260 in mask free areas (which may be one or more layers of n-doped (In)GaN as set out at points 1-6 above); Porosification of structures 260 to 'further' relax the structures grown in mask free areas; InGaN interlayer 230 overgrowth on top of the porous structures 260. The aspect ratio of the overgrown porous region 260 (white pillars in FIG. 23B) should be greater than 1 and preferably more than 3.

FIG. 21C shows a semiconductor structure formed by the steps of: Porosification of InGaN template 220; Dry or wet etching to create pillars in porosified template 210; Overgrowth of InGaN interlayer 230 on top of pillars.

Overgrowth of Strain Relaxed InGaN

Option 1) No pattern on or in porous InGaN stack before overgrowth of InGaN interlayer.

Option 2) Mask and pattern on the porous InGaN, then overgrow InGaN interlayer 230 and InGaN QWs on top.

Option 3) Mask and pattern on the porous InGaN stack—overgrowth of (In)GaN—porosify the overgrown (In)GaN structure—overgrow InGaN on top of the porous (In)GaN. The aspect ratio of the overgrown porous region (white pillars in FIGS. 23B and 24B) should be greater than 1 and preferably more than 3

Option 4. Mask and define patterns in the porous InGaN stack—overgrow InGaN interlayer followed by QWs Patterns can be any shape, any size (50 nm-100 micrometer), and processed using any materials.(square, hexagon, circle, stripe).

Overgrown pattern is aligned to a certain orientation, semi-polar and non-polar for instance.

InGaN overgrowth with connecting GaN layer, which is to help smooth the surface, as InGaN layers tends to have lot of surface pits.

FIGS. 22A, 22B, and 22C focus on the application of these semiconductor structures as micro-LEDs.

FIGS. 22A, 22B, 22C show the structures of FIGS. 21A, 21B, and 21C, following overgrowth of a light emitting region 270 containing InGaN QWs, and p-(In)GaN layer 280, to form micro-LEDs.

These Figures show LED devices formed on strain compliant (In)GaN templates (template 210 for example).

After the preparation of the strain compliant (In)GaN, InGaN quantum wells and p-(In)GaN can be further grown to form the LED structure. As shown in FIGS. 22A-22C, the QWs and p-(In)GaN can be overgrown on either bulk porous compliant III-nitride material, or patterned porous compliant III-nitride material that has been etched into a pattern.

The invention claimed is:

1. A semiconductor structure comprising:
a layer of a first III-nitride material having a first lattice dimension;
a non-porous layer of a second III-nitride material having a second lattice dimension different from the first lattice dimension; and
a porous region of a third III-nitride material disposed between the layer of first III-nitride material and the non-porous layer of the second III-nitride material;
in which the second III-nitride material is $In_xGa_{1-x}N$ and $0.1<x<0.8$, and
in which the third III-nitride material of the porous region is $In_yGa_{1-y}N$, in which $0 \leq y \leq x$.

2. A semiconductor structure according to claim 1, in which the first III-nitride material is (Al,In)GaN.

3. A semiconductor structure according to claim 1, in which the second III-nitride material is $In_xGa_{1-x}N$ and $0.10<x<0.35$, and/or in which the second III-nitride material is n-doped $In_xGa_{1-x}N$.

4. A semiconductor structure according to claim 1, in which the porous region is formed from the same III-nitride material as the non-porous layer of the second III-nitride material, and/or in which the non-porous layer of the second III-nitride material shares an epitaxial boundary with the porous region.

5. A semiconductor structure according to claim 1, comprising one or more intermediate layers of III-nitride material disposed between the porous region and the non-porous layer of the second III-nitride material, optionally in which the intermediate layer is (Al,In)GaN.

6. A semiconductor structure according to claim 1, in which the porous region is a porous layer, or a stack of layers comprising a plurality of porous layers.

7. A semiconductor structure according to claim 1, comprising a further layer of a third III-nitride material having a third lattice dimension different from the first and second lattice dimensions, in which the non-porous layer of the second III-nitride material is disposed between the further layer and the porous region.

8. A semiconductor structure according to claim 1, in which a surface of the non-porous layer of the second III-nitride material is an outer surface of the structure, and in which the semiconductor structure is suitable for overgrowth of further semiconductor material onto the surface of the non-porous layer.

9. An optoelectronic semiconductor device, comprising:
a semiconductor structure according to claim 1; and
an active light emitting region.

10. A light-emitting diode (LED), comprising:
a semiconductor structure according to claim 1; and
an LED active light emitting region formed on the non-porous layer of the second III-nitride material.

11. An LED according to claim 10, in which the non-porous layer of the second III-nitride material is a doped layer which forms one side of a p-i-n junction, or comprising one or more intermediate layers of III-nitride material disposed between the non-porous layer of the second III-nitride material and the LED active region.

12. An LED according to claim 10, in which the LED active light emitting region comprises one or more InGaN quantum wells.

13. An LED according to claim 12, in which the LED is a green LED and the InGaN quantum wells and the second III-nitride material both have a composition $In_xGa_{1-x}N$, in which $0.22 \leq x \leq 0.30$.

14. An LED according to claim 12, in which the LED is a red LED and the InGaN quantum wells and the second III-nitride material both have a composition $In_xGa_{1-x}N$, in which $0.32 \leq x \leq 0.40$.

15. An LED according to claim 12, comprising an intermediate InGaN layer between the non-porous layer of the second III-nitride material and the LED active region, in which the intermediate InGaN layer has an indium at. % content of between 1.2 and 8 times less than the indium at. % content in the quantum wells in the light emitting region, and/or in which the intermediate InGaN layer has a thickness of between 1.5 and 10 times less than the LED active light emitting region comprising one or more InGaN quantum wells.

16. A method of forming an optoelectronic device, comprising the step of: forming an active light emitting region on the semiconductor structure of claim 1.

17. A method of manufacturing a semiconductor structure, comprising the steps of:
electrochemically porosifying a region of III-nitride material formed on a layer of a first III-nitride material having a first lattice dimension, to form a porous region of III-nitride material; and depositing, over the porous region of III-nitride material, a non-porous layer of a second III-nitride material having a second lattice dimension different from the first lattice dimension, so that the porous region is disposed between the layer of the first III-nitride material and the non-porous layer of the second III-nitride material;

in which the second III-nitride material is $In_xGa_{1-x}N$ and $0.1 < x < 0.8$, and in which the porous region is formed from a third III-nitride material which is $In_yGa_{1-y}N$, in which $0 \leq y \leq x$.

18. A method according to claim 17, comprising the step of porosifying the porous region through a non-porous intermediate layer of III-nitride material, or comprising the step of depositing one or more intermediate layers of III-nitride material on the surface of the porous region of III-nitride material, and then depositing the non-porous layer of a second III-nitride material on the one or more intermediate layers, or comprising the step of depositing the non-porous layer of a second III-nitride material onto the surface of the porous region of III-nitride material, and/or comprising the step of overgrowing one or more layers of III-nitride material on the surface of the non-porous layer of the second III-nitride material.

* * * * * 25